(12) United States Patent
Johnson et al.

(10) Patent No.: US 7,251,264 B2
(45) Date of Patent: Jul. 31, 2007

(54) DISTRIBUTED BRAGG REFLECTOR FOR OPTOELECTRONIC DEVICE

(75) Inventors: Ralph H. Johnson, Murphy, TX (US);
Klein L. Johnson, Orono, MN (US);
Jimmy A. Tatum, Plano, TX (US);
James K. Guenter, Garland, TX (US);
James R. Biard, Richardson, TX (US);
Robert A. Hawthorne, III, Garland, TX (US)

(73) Assignee: Finisar Corporation, Sunnyvale, CA (US)

( * ) Notice: Subject to any disclaimer, the term of this patent is extended or adjusted under 35 U.S.C. 154(b) by 270 days.

(21) Appl. No.: 11/119,292

(22) Filed: Apr. 29, 2005

(65) Prior Publication Data

US 2005/0190812 A1    Sep. 1, 2005

Related U.S. Application Data

(62) Division of application No. 10/283,381, filed on Oct. 28, 2002, now Pat. No. 6,990,135.

(51) Int. Cl.
*H01S 3/08* (2006.01)
(52) U.S. Cl. .......................... 372/96; 372/99; 372/103
(58) Field of Classification Search .................. 372/96, 372/99, 103
See application file for complete search history.

(56) References Cited

U.S. PATENT DOCUMENTS

| | | | |
|---|---|---|---|
| 4,317,085 A | 2/1982 | Brunham et al. | 372/50 |
| 4,466,694 A | 8/1984 | MacDonald | 385/37 |
| 4,660,207 A | 4/1987 | Svilans | 372/45 |
| 4,675,058 A | 6/1987 | Plaster | 438/41 |
| 4,784,722 A | 11/1988 | Liau et al. | 438/34 |
| 4,885,592 A | 12/1989 | Kofol et al. | 343/754 |

(Continued)

FOREIGN PATENT DOCUMENTS

DE    4240706 A1    6/1994

(Continued)

OTHER PUBLICATIONS

Banwell et al., "VCSE Laser Transmitters for Parallel Data Links", *IEEE Journal of Quantum Electronics*, vol. 29, No. 2, Feb. 1993, pp. 635-644.

(Continued)

*Primary Examiner*—Armando Rodriguez
(74) *Attorney, Agent, or Firm*—Workman Nydegger

(57) ABSTRACT

This disclosure concerns devices such as DBRs, one example of which includes at least one first mirror layers having an oxidized region extending from an edge of the DBR to an oxide termination edge that is situated greater than a first distance from the edge of the DBR. The DBR also includes at least one second mirror layer having an oxidized region extending from the edge of the DBR to an oxide termination edge that is situated less than a second distance from the edge of the DBR, such that the first distance is greater than the second distance. Additionally, a first mirror layer includes an oxidizable material at a concentration that is higher than the concentration of the oxidizable material in any of the second mirror layers. Finally, a first mirror layer is doped with an impurity at a higher level than one of the second mirror layers.

21 Claims, 11 Drawing Sheets

U.S. PATENT DOCUMENTS

| | | | | |
|---|---|---|---|---|
| 4,901,327 A | 2/1990 | Bradley | | 372/45 |
| 4,943,970 A | 7/1990 | Bradley | | 372/45 |
| 4,956,844 A | 9/1990 | Goodhue et al. | | 372/44 |
| 5,031,187 A | 7/1991 | Orenstein et al. | | 372/50 |
| 5,052,016 A | 9/1991 | Mahbobzadeh | | 372/96 |
| 5,056,098 A | 10/1991 | Anthony et al. | | 372/45 |
| 5,062,115 A | 10/1991 | Thornton | | 372/50 |
| 5,068,869 A | 11/1991 | Wang et al. | | 372/45 |
| 5,079,774 A | 1/1992 | Mendez et al. | | 372/27 |
| 5,115,442 A | 5/1992 | Lee et al. | | 372/45 |
| 5,117,469 A | 5/1992 | Cheung et al. | | 385/11 |
| 5,140,605 A | 8/1992 | Paoli et al. | | 372/50 |
| 5,157,537 A | 10/1992 | Rosenblatt et al. | | 359/245 |
| 5,158,908 A | 10/1992 | Blonder et al. | | 438/32 |
| 5,216,263 A | 6/1993 | Paoli | | 257/88 |
| 5,216,680 A | 6/1993 | Magnusson et al. | | 372/20 |
| 5,237,581 A | 8/1993 | Asada et al. | | 372/45 |
| 5,245,622 A | 9/1993 | Jewell et al. | | 372/45 |
| 5,258,990 A | 11/1993 | Olbright et al. | | 372/46 |
| 5,262,360 A | 11/1993 | Holonyak, Jr. et al. | | 438/767 |
| 5,285,466 A | 2/1994 | Tabatabaie | | 372/50 |
| 5,293,392 A | 3/1994 | Shieh et al. | | 372/45 |
| 5,317,170 A | 5/1994 | Paoli | | 257/88 |
| 5,317,587 A | 5/1994 | Ackley et al. | | 372/45 |
| 5,325,386 A | 6/1994 | Jewell et al. | | 372/50 |
| 5,331,654 A | 7/1994 | Jewell et al. | | 372/45 |
| 5,337,074 A | 8/1994 | Thornton | | 347/237 |
| 5,337,183 A | 8/1994 | Rosenblatt et al. | | 359/248 |
| 5,349,599 A | 9/1994 | Larkins | | 372/50 |
| 5,351,256 A | 9/1994 | Schneider et al. | | 372/45 |
| 5,359,447 A | 10/1994 | Hahn et al. | | 398/201 |
| 5,359,618 A | 10/1994 | Lebby et al. | | 372/45 |
| 5,363,397 A | 11/1994 | Collins et al. | | 372/92 |
| 5,373,520 A | 12/1994 | Shoji et al. | | 372/45 |
| 5,373,522 A | 12/1994 | Holonyak, Jr. et al. | | 372/45 |
| 5,386,426 A | 1/1995 | Stephens | | 372/20 |
| 5,390,209 A | 2/1995 | Vakhshoori | | 372/45 |
| 5,396,508 A | 3/1995 | Bour et al. | | 372/27 |
| 5,404,373 A | 4/1995 | Cheng | | 372/50 |
| 5,412,678 A | 5/1995 | Treat et al. | | 372/45 |
| 5,412,680 A | 5/1995 | Swirhun et al. | | 372/45 |
| 5,416,044 A | 5/1995 | Chino et al. | | 438/39 |
| 5,428,634 A | 6/1995 | Bryan et al. | | 372/45 |
| 5,438,584 A | 8/1995 | Paoli et al. | | 372/45 |
| 5,446,754 A | 8/1995 | Jewell et al. | | 372/50 |
| 5,465,263 A | 11/1995 | Bour et al. | | 372/23 |
| 5,475,701 A | 12/1995 | Hibbs-Brenner | | 372/50 |
| 5,493,577 A | 2/1996 | Choquette et al. | | 372/46 |
| 5,497,390 A | 3/1996 | Tanaka et al. | | 372/50 |
| 5,513,202 A | 4/1996 | Kobayashi et al. | | 372/96 |
| 5,530,715 A | 6/1996 | Shieh et al. | | 372/96 |
| 5,555,255 A | 9/1996 | Kock et al. | | 372/96 |
| 5,557,626 A | 9/1996 | Grodinski et al. | | 372/43 |
| 5,561,683 A | 10/1996 | Kwon | | 372/96 |
| 5,567,980 A | 10/1996 | Holonyak, Jr. et al. | | 257/631 |
| 5,568,499 A | 10/1996 | Lear | | 372/45 |
| 5,574,738 A | 11/1996 | Morgan | | 372/25 |
| 5,581,571 A | 12/1996 | Holonyak, Jr. et al. | | 372/46 |
| 5,586,131 A | 12/1996 | Ono et al. | | 372/19 |
| 5,590,145 A | 12/1996 | Nitta | | 372/50 |
| 5,598,300 A | 1/1997 | Magnusson et al. | | 359/566 |
| 5,606,572 A | 2/1997 | Swirhun et al. | | 372/96 |
| 5,625,729 A | 4/1997 | Brown | | 385/31 |
| 5,642,376 A | 6/1997 | Olbright et al. | | 372/99 |
| 5,645,462 A | 7/1997 | Banno et al. | | 445/51 |
| 5,646,978 A | 7/1997 | Kern et al. | | 455/436 |
| 5,648,978 A | 7/1997 | Sakata | | 372/50 |
| 5,696,023 A | 12/1997 | Holonyak, Jr. et al. | | 438/767 |
| 5,699,373 A | 12/1997 | Uchida et al. | | 372/27 |
| 5,712,188 A | 1/1998 | Chu et al. | | 438/40 |
| 5,726,805 A | 3/1998 | Kaushik et al. | | 359/589 |
| 5,727,013 A | 3/1998 | Botez et al. | | 372/96 |
| 5,727,014 A | 3/1998 | Wang et al. | | 372/96 |
| 5,774,487 A | 6/1998 | Morgan | | 372/45 |
| 5,778,018 A | 7/1998 | Yoshikawa et al. | | 372/45 |
| 5,784,399 A | 7/1998 | Sun | | 372/50 |
| 5,818,066 A | 10/1998 | Duboz | | 257/21 |
| 5,828,684 A | 10/1998 | Van de Walle | | 372/45 |
| 5,838,705 A | 11/1998 | Shieh et al. | | 372/45 |
| 5,838,715 A | 11/1998 | Corzine et al. | | 372/46 |
| 5,896,408 A | 4/1999 | Corzine et al. | | 372/46 |
| 5,901,166 A | 5/1999 | Nitta et al. | | 372/56 |
| 5,903,588 A | 5/1999 | Guenter et al. | | 372/46 |
| 5,903,589 A | 5/1999 | Jewell | | 372/46 |
| 5,903,590 A | 5/1999 | Hadley et al. | | 372/96 |
| 5,908,408 A | 6/1999 | McGary et al. | | 604/110 |
| 5,940,422 A | 8/1999 | Johnson | | 372/45 |
| 5,953,362 A | 9/1999 | Pamulapati et al. | | 372/96 |
| 5,978,401 A | 11/1999 | Morgan | | 372/56 |
| 5,978,408 A | 11/1999 | Thornton | | 372/96 |
| 5,995,531 A | 11/1999 | Gaw et al. | | 372/96 |
| 6,002,705 A | 12/1999 | Thornton | | 372/96 |
| 6,008,675 A | 12/1999 | Handa | | 372/96 |
| 6,014,395 A | 1/2000 | Jewell | | 372/45 |
| 6,043,104 A | 3/2000 | Uchida et al. | | 438/32 |
| 6,055,262 A | 4/2000 | Cox et al. | | 372/96 |
| 6,078,601 A | 6/2000 | Smith | | 372/29.014 |
| 6,144,682 A | 11/2000 | Sun | | 372/45 |
| 6,154,480 A | 11/2000 | Magnusson et al. | | 372/96 |
| 6,185,241 B1 | 2/2001 | Sun | | 372/96 |
| 6,191,890 B1 | 2/2001 | Baets et al. | | 359/572 |
| 6,208,681 B1 | 3/2001 | Thornton | | 372/96 |
| 6,212,312 B1 | 4/2001 | Grann et al. | | 385/24 |
| 6,238,944 B1 | 5/2001 | Floyd | | 438/45 |
| 6,269,109 B1 | 7/2001 | Jewell | | 372/43 |
| 6,297,068 B1 | 10/2001 | Thornton | | 438/46 |
| 6,317,446 B1 | 11/2001 | Wipiejewski | | |
| 6,320,893 B1 | 11/2001 | Ueki | | |
| 6,372,533 B2 | 4/2002 | Jayaraman et al. | | 438/22 |
| 6,411,638 B1 | 6/2002 | Johnson et al. | | 372/46 |
| 6,459,713 B2 | 10/2002 | Jewell | | 372/46 |
| 6,545,335 B1 | 4/2003 | Chua et al. | | |
| 6,570,905 B1 | 5/2003 | Ebeling | | |
| 6,700,914 B2 | 3/2004 | Yokouchi et al. | | |
| 6,829,283 B2 | 12/2004 | Ebeling | | |
| 2002/0154675 A1 | 10/2002 | Deng et al. | | |

FOREIGN PATENT DOCUMENTS

| | | |
|---|---|---|
| EP | 0288184 A2 | 10/1988 |
| EP | 0776076 A1 | 5/1997 |
| JP | 60123084 | 1/1985 |
| JP | 02054981 | 2/1990 |
| JP | 5299779 | 11/1993 |
| WO | WO 98/57402 | 12/1998 |
| WO | WO 02/037630 | 10/2002 |

OTHER PUBLICATIONS

Bowers et al., "Fused Vertical Cavity Lasers With Oxide Aperture", Final report for MICRO project 96-042, Industrial Sponsor: Hewlett Packard, 4 pages, 1996-97.

Catchmark et al., "High Temperature CW Operation of Vertical Cavity Top Surface-Emitting Lasers", CLEO 1993, p. 138.

Chemla et al., "Nonlinear Optical Properties of Semiconductor Quantum Wells", *Optical Nonlinearities and Instabilities in Semiconductors*, Academic Press, Inc., Copyright 1988, pp. 83-120.

Choe, et al., "Lateral oxidation of AIAs layers at elevated water vapour pressure using a closed-chamber system," Letter to the Editor, Semiconductor Science Technology, 15, pp. L35-L38, Aug. 2000.

Choa et al., "High-Speed Modulation of Vertical-Cavity Surface-Emitting Lasers", *IEEE Photonics Technology Letter*, vol. 3, No. 8, Aug. 1991, pp. 697-699.

Choquette et al., "High Single Mode Operation from Hybrid Ion Implanted/Selectively Oxidized VCSELs", 2000 IEEE 17th International Semiconductor Laser Conference, Monterrey, CA pp. 59-60.

Choquette et al., "Lithographically-Defined Gain Apertures Within Selectively Oxidized VCSELs", paper CtuL6, Conference on Lasers and Electro-Optics, San Francisco, California (2000).

Choquette, et al., "VCSELs in information systems: 10Gbps$^{-1}$ oxide VCSELs for data communication", Optics In Information Systems, vol. 12, No. 1, p. 5, SPIE International Technical Group Newsletter, Apr. 2001.

Chua, et al., "Low-Threshold 1.57- µ m VC-SEL's Using Strain-Compensated Quantum Wells and Oxide/Metal Backmirror," IEEE Photonics Technology Letters, vol. 7, No. 5, pp. 444-446, May 1995.

Chua, et al., "Planar Laterally Oxidized Vertical-Cavity Lasers for Low-Threshold High-Density Top-Surface-Emitting Arrays," IEEE Photonics Technology Letters, vol. 9, No. 8, pp. 1060-1062, Aug. 1997.

Cox, J. A., et al., "Guided Mode Grating Resonant Filters for VCSEL Applications", *Proceedings of the SPIE*, The International Society for Engineering, Diffractive and Holographic Device Technologies and Applications V, San Jose, California, Jan. 28-29, 1998, vol. 3291, pp. 70-71.

Farrier, Robert G., "Parametric control for wafer fabrication: New CIM techniques for data analysis," Solid State Technology, pp. 99-105, Sep. 1997.

Fushimi, et al., "Degradation Mechanism in Carbon-doped GaAs Minority-carrier Injection Devices," 34th Annual IRPS Proceedings, Dallas, TX., Apr. 29-May 2, 1996, 8 pages.

G. G. Ortiz, et al., "Monolithic Integration of In0.2 GA0.8As Vertical Cavity Surface-Emitting Lasers with Resonance-Enhanced Quantum Well Photodetectors", *Electronics Letters*, vol. 32, No. 13, Jun. 20, 1996, pp. 1205-1207.

G. Shtengel et al., "High-Speed Vertical-Cavity Surface-Emitting Lasers", *Photon. Tech. Lett.*, vol. 5, No. 12, pp. 1359-1361 (Dec. 1993).

Geib, et al., "Comparison of Fabrication Approaches for Selectively Oxidized VCSEL Arrays," Proceedings of SPIE, vol. 3946, pp. 36-40, 2000.

Graf, Rudolph, *Modern Dictionary of Electronics*, 6th ed., Indiana: Howard W. Sams & Company, 1984, p. 694.

Guenter et al., "Reliability of Proton-Implanted VCSELs for Data Communications", Invited paper, *SPIE*, vol. 2683, OE LASE 96; Photonics West: Fabrication, Testing and Reliability of Semiconductor Lasers, (SPIE, Bellingham, WA 1996).

Guenter, et al., "Commercialization of Honeywell's VCSEL technology: further developments," Proceedings of the SPIE, vol. 4286, GSPIE 2000, 14 pages.

Hadley et al., "High-Power Single Mode Operation from Hybrid Ion Implanted/Selectively Oxidized VCSELs", 13th Annual Meeting IEEE Lasers and Electro-Optics Society 2000 Annual Meeting (LEOS 2000), Rio Grande, Puerto Rico, pp. 804-805.

Hawthorne, et al., "Reliability Study of 850 nm VCSELs for Data Communications," IEEE, pp. 1-11, May 1996.

Herrick, et al., "Highly reliable oxide VCSELs manufactured at HP/Agilent Technologies," Invited Paper, Proceedings of SPIE vol. 3946, pp. 14-19, 2000.

Hibbs-Brenner et al., "Performance, Uniformity and Yield of 850nm VCSELs Deposited by MOVPE", *IEEE Phot. Tech. Lett.*, vol. 8, No. 1, pp. 7-9, Jan. 1996.

Hideaki Saito, et al., "Controlling polarization of quantum-dot surface-emitting lasers by using structurally anisotropic self-assembled quantum dots," American Institute of Physics, Appl, Phys. Lett. 71 (5), pp. 590-592, Aug. 4, 1997.

Hornak et al., "Low-Termperature (10K-300K) Characterization of MOVPE-Grown Vertical-Cavity Surface-Emitting Lasers", *Photon. Tech. Lett.*, vol. 7, No. 10, pp. 1110-1112, Oct. 1995.

Huffaker et al., "Lasing Characteristics of Low Threshold Microcavity Layers Using Half-Wave Spacer Layers and Lateral Index Confinement", *Appl. Phys. Lett.*, vol. 66, No. 14, pp. 1723-1725, Apr. 3, 1995.

Jewell et al., "Surface Emitting Microlasers for Photonic Switching & Intership Connections", *Optical Engineering*, vol. 29, No. 3, pp. 210-214, Mar. 1990.

Jiang et al., "High-Frequency Polarization Self-Modulation in Vertical-Cavity Surface-Emitting Lasers", *Appl. Phys. Letters*, vol. 63, No. 26, Dec. 27, 1993, pp. 2545-2547.

K.L. Lear et al., "Selectively Oxidized Vertical Cavity Surface-Emitting Lasers with 50% Power Conversion Efficiency", *Elec. Lett.*, vol. 31, No. 3 pp. 208-209, Feb. 2, 1995.

Kash, et al., "Recombination in GaAs a the AlAs oxide-GaAs interface," Applied Physics Letters, vol. 67, No. 14, pp. 2022-2024, Oct. 2, 1995.

Kishino et al., "Resonant Cavity-Enhanced (RCE) Photodetectors", *IEEE Journal of Quantum Electronics*, vol. 27, No. 8, pp. 2025-2034.

Koley B., et al., "Dependence of lateral oxidation rate on thickness of AlAs layer of interest as a current aperture in vertical-cavity surface-emitting laser structures", Journal of Applied Physics, vol. 84, No. 1, pp. 600-605, Jul. 1, 1998.

Kuchibhotla et al., "Low-Voltage High Gain Resonant_Cavity Avalanche Photodiode", *IEEE Photonics Technology Letters*, vol. 3, No. 4, pp. 354-356.

Lai et al., "Design of a Tunable GaAs/AlGaAs Multiple-Quantum-Well Resonant Cavity Photodetector", *IEEE Journal of Quantum Electronics*, vol. 30, No. 1, pp. 108-114.

Lee et al., "Top-Surface Emitting GaAs Four-Quantum-Well Lasers Emitting at 0-85 um", *Electronics Letters*, vol. 24, No. 11, May 24, 1990, pp. 710-711.

Lehman et al., "High Frequency Modulation Characteristics of Hybrid Dielectric/AlGaAs Mirror Singlemode VCSELs" *Electronic Letters*, vol. 31, No. 15, Jul. 20, 1995, pp. 1251-1252.

Maeda, et al., "Enhanced Glide of Dislocations in GaAs Single Crystals by Electron Beam Irradiation," Japanese Journal of Applied Physics, vol. 20, No. 3, pp. L165-L168, Mar. 1981.

Magnusson, "Integration of Guided-Mode Resonance Filters and VCSELs", Electo-Optics Research Center, Department of Electrical Engineering, University of Texas at Arlington, May 6, 1997.

Martinsson et al., "Transverse Mode Selection in Large-Area Oxide-Confined Vertical-Cavity Surface-Emitting Lasers Using a Shallow Surface Relief", *IEEE Photon. Technol. Lett.*, 11(12), 1536-1538 (1999).

Miller et al., "Optical Bistability Due to Increasing Absorption", *Optics Letters*, vol. 9, No. 5, May 1984, pp. 162-164.

Min Soo Park and Byung Tae Ahn, "Polarization control of vertical-cavity surface-emitting lasers by electro-optic birefringence," Applied Physics Letter, vol. 76, No. 7, pp. 813-815, Feb. 14, 2000.

Morgan et al., "200 C, 96-nm Wavelength Range, Continuous-Wave Lasing from Unbonded GaAs MOVPE-Grown Vertical Cavity Surface-Emitting Lasers", *IEEE Photonics Technology Letters*, vol. 7, No. 5, May 1995, pp. 441-443.

Morgan et al., "High-Power Coherently Coupled 8×8 Vertical Cavity Surface Emitting Laser Array", *Appl. Phys Letters*, vol. 61, No. 10, Sep. 7, 1992, pp. 1160-1162.

Morgan et al., "Hybrid Dielectric/AlGaAs Mirror Spatially Filtered Vertical Cavity Top-Surface Emitting Laser", *Appl. Phys. Letters*, vol. 66, No. 10, Mar. 6, 1995, pp. 1157-1159.

Morgan et al., "Novel Hibrid-DBR Single-Mode Controlled GaAs Top-Emitting VCSEL with Record Low Voltage", 2 pages, dated prior to Dec. 29, 2000.

Morgan et al., "One Watt Vertical Cavity Surface Emitting Laser", *Electron. Lett.*, vol. 29, No. 2, pp. 206-207, Jan. 21, 1993.

Morgan et al., "Producible GaAs-based MOVPE-Grown Vertical-Cavity Top-Surface Emitting Lasers with Record Performance", *Elec. Lett.*, vol. 31, No. 6, pp. 462-464, Mar. 16, 1995.

Morgan et al., "Progress and Properties of High-Power Coherent Vertical Cavity Surface Emitting Laser Arrays", *SPIE*, Vo. 1850, Jan. 1993, pp. 100-108.

Morgan et al., "Progress in Planarized Vertical Cavity Surface Emitting Laser Devices and Arrays", *SPIE*, vol. 1562, Jul. 1991, pp. 149-159.

Morgan et al., "Spatial-Filtered Vertical-Cavity Top Surface-Emitting Lasers", CLEO, 1993, pp. 138-139.

Morgan et al., "Submilliamp, Low-Resistance, Continuous-Wave, Single-Mode GaAs Planar Vertical-Cavity Surface Emitting Lasers", Honeywell Technology Center, Jun. 6, 1995.

Morgan et al., "Transverse Mode Control of Vertical-Cavity Top-Surface Emitting Lasers", *IEEE Photonics Technology Letters*, vol. 4, No. 4, Apr. 1993, pp. 374-377.

Morgan et al., "Vertical-cavity surface-emitting laser arrays", Invited Paper, *SPIE*, vol. 2398, Feb. 6, 1995, pp. 65-93.

Morgan et al., Vertical-cavity surface emitting lasers come of age, Invited paper, *SPIE*, vol. 2683, 0-8194-2057, Mar. 1996, pp. 18-29.

Morgan, "High-Performance, Producible Vertical Cavity Lasers for Optical Interconnects", *High Speed Electronics and Systems*, vol. 5, No. 4, Dec. 1994, pp. 65-95.

Naone R.L., et al., "Tapered-apertures for high-efficiency miniature VCSELs", LEOS newsletter, vol. 13, No. 4, pp. 1-5, Aug. 1999.

Nugent et al., "Self-Pulsations in Vertical-Cavity Surface-Emitting Lasers", *Electronic Letters*, vol. 31, No. 1, Jan. 5, 1995, pp. 43-44.

Oh, T. H. et al., "Single-Mode Operation in Antiguided Vertical-Cavity Surface-Emitting Laser Using a Low-Temperature Grown AlGaAs Dielectric Aperture", *IEEE Photon. Technol. Lett*, 10(8), 1064-1066 (1998).

Osinski, et al., "Temperature and Thickness Dependence of Steam Oxidation of AlAs in Cylindrical Mesa Structure," IEEE Photonics Technology Letters, vol. 13, No. 7, pp. 687-689, Jul. 2001.

Peck, D. Stewart, Comprehensive Model for Humidity Testing Correlation, IEEE/IRPS, pp. 44-50, 1986.

Ries, et al., "Visible-spectrum ($\lambda$ =650nm) photopumped (pulsed, 300 K) laser operation of a vertical cavity AlAs-AlGaAs/InAlP-InGaP quantum well heterostructure utilizing native oxide mirrors," Applied Physics Letters, vol. 67, No. 8, pp. 1107-1109, Aug. 21, 1995.

S.S. Wang and R. Magnusson, "Multilayer Waveguide-Grating Filters", *Appl. Opt.*, vol. 34, No. 14, pp. 2414-2420, 1995.

S.S. Wang and R. Magnusson, "Theory and Applications of Guided-Mode Resonance Filters", *Appl. Opt.*, vol. 32, No. 14, pp. 2606-2613, 1993.

Sah, et al., "Carrier Generation and Recombination in *P-N* Junctions and *P-N* Junction Characteristics," Proceedings of the IRE, pp. 1228-1243, Sep. 1957.

Schubert, "Resonant Cavity Light-Emitting Diode", *Appl. Phys. Lett.*, vol. 60, No. 8, pp. 921-923, Feb. 24, 1992.

Shi, et al., "Photoluminescence study of hydrogenated aluminum oxide-semiconductor interface," Applied Physics Letters, vol. 70, No. 10, pp. 1293-1295, Mar. 10, 1997.

Smith, R.E. et al., Polarization-Sensitive Subwavelength Antireflection Surfaces on a Semiconductor for 975 NM, *Optics Letters*, vol. 21, No. 15, Aug. 1, 1996, pp. 1201-1203.

Spicer, et al., "The Unified Model For Schottky Barrier Formation and MOS Interface States in 3-5 Compounds," Applications of Surface Science, vol. 9, pp. 83-101, 1981.

Suning Tang et al., "Design Limitations of Highly Parallel Free-Space Optical Interconnects Based on Arrays of Vertical Cavity Surface-Emitting Laser Diodes, Microlenses, and Photodetectors", Journal of Lightwave Technology, vol. 12, No. 11, Nov. 1, 1994, pp. 1971-1975.

T. Mukaihara, "Polarization Control of Vertical-cavity Surface-Emitting Lasers by a Birefringent Metal/Semiconductor Polarizer Terminating a Distributed Bragg Reflector," Tokyo Institute of Technology, Precision and Intelligence Laboratory, pp. 183-184.

Tao, Andrea, "Wet-Oxidation of Digitally Alloyed AlGaAs," National Nanofabrication Users Network, Research Experience for Undergraduates 2000, 2 pages.

Tautm, et al., Commerialization of Honeywell's VCSEL Technology, Published in Proceedings of the SPIE, vol. 3946, SPI, 2000, 12 pages.

Tshikazu Mukaihara, et al., "A Novel Birefringent Distributed Bragg Reflector Using a Metal/Dielectric Polarizer for Polarization Control of Surface-Emitting Lasers," Japan Appl. Phys. vol. 33 (1994) pp. L227-L229, Part 2, No. 2B, Feb. 15, 1994.

Tu, Li-Wei et al., "Transparent conductive metal-oxide contacts in vertical-injection top-emitting quantum well lasers", Appl. Phys. Lett. 58 (8) Feb. 25, 1991, pp. 790-792.

Wieder, H.H., "Fermi level and surface barrier of $Ga_xIn_{1-x}As$ alloys," Applied Physics Letters, vol. 38, No. 3, pp. 170-171, Feb. 1, 1981.

Wipiejewski, et al., "VCSELs for datacom applications," Invited Paper, Part of the SPIE Conference on Vertical-Cavity Surface-Emitting Lasers III, San Jose, California, SPIE vol. 3627, pp. 14-22, Jan. 1999.

Y. M. Yang et al., "Ultralow Threshold Current Vertical Cavity Surface Emitting Lasers Obtained with Selective Oxidation", *Elect. Lett.*, vol. 31, No. 11, pp. 886-888, May 25, 1995.

Yablonovitch et al., "Photonic Bandgap Structures", *J. Opt. Soc. Am. B.*, vol. 10, No. 2, pp. 283-295, Feb. 1993.

Young et al., "Enhanced Performance of Offset-Gain High Barrier Vertical-Cavity Surface-Emitting Lasers", *IEEE J. Quantum Electron.*, vol. 29, No. 6, pp. 2013-2022, Jun. 1993.

U.S. Appl. No. 09/751,422, filed Dec. 29, 2000, entitled "Resonant Reflector for Use with Optoelectronic Devices".

U.S. Appl. No. 09/751,423, filed Dec. 29, 2000, entitled "Spatially Modulated Reflector for an Optoelectronic Device".

Choquette, Kent D., et al., Design of Oxide Aperture Profile within Selectively Oxidized VCSELs, IEEE, Conference Proceedings, LEOS '98, 11th Annual Meeting, Orlando, Florida, Dec. 1-4, 1998, pp. 179-180.

Choquette, Kent D. et al., Design of Oxide Aperture Profile within Selectively Oxidized VCSELs, IEEE, Conference Proceedings, LEOS '98, 11th Annual Meeting, Orlando, Florida, Dec. 1-4, 1998, pp. 179-180.

Choquette, et al., "VCSELs in information systems: 1OGbps[-1] oxide VSCELs for data communication", Optics In Information Systems, vol. 12, No. 1, p. 5, SPIE International Technical Group Newsletter, Apr. 2001.

Chua, et al, "Planar Laterally Oxidized Vertical-Cavity Lasers for Low-Threshold High-Density Top-Surface-Emitting Arrays," IEEE Photonics Technology Letters, vol. 9, No. 8, pp. 1060-1062, Aug. 1997.

Graf, Rudolph, *Modern Dictionary of Electronics*, 6th ed., Indiana: Howard W. Sams & Company, 1984, p. 694.

Hornak et al., "Low-Temperature (10K-300K) Characterization of MOVPE-Grown Vertical-Cavity Surface-Emitting Lasers", *Photon. Tech. Lett.*, vol. 7, No. 10, pp. 1110-1112, Oct. 1995.

Kash, et al., "Recombination in GaAs at the AlAs oxide-GaAs interface," Applied Physics Letters, vol. 67, No. 14, pp. 2022-2024, Oct. 2, 1995.

Kuchibhotla et al., "Low-Voltage High Gain Resonant Cavity Avalanche Photodiode", *IEEE Photonics Technology Letters*, vol. 3, No. 4, pp. 354-356.

Lai et al., "Design of a Tunable GaAs/AlGaAs Multiple-Quantum-W ell Resonant Cavity Photo detector", *IEEE Journal of Quantum Electronics*, vol. 30, No. 1, pp. 108-114.

Morgan et al., "Hybrid Dielectric/ AlGaAs Mirror Spatially Filtered Vertical Cavity Top-Surface Emitting Laser", *Appl. Phys. Letters*, vol. 66, No. 10, Mar. 6, 1995, pp. 1157-1159.

Morgan et al., "One-Watt Vertical Cavity Surface Emitting Laser", *Electron. Lett.*, vol. 29, No. 2, pp. 206-207, Jan. 21, 1993.

Naone RL., et al., "Tapered-apertures for high-efficiency miniature VCSELs", LEOS newsletter, vol. 13, No. 4, pp. 1-5, Aug. 1999.

S.S. Wang and R Magnusson, "Multilayer Waveguide-Grating Filters", *Appl. Opt.*, vol. 34, No. 14, pp. 2414-2420, 1995.

S.S. Wang and R Magnusson, "Theory and Applications of Guided-Mode Resonance Filters", *Appl. Opt.*, vol. 32, No. 14, pp. 2606-2613, 1993.

Sugimoto, M., et al. "Very Low Threshold Current Density in Vertical-Cavity Surface-Emitting Laser Diodes with Periodically Doped Distributed Bragg Reflectors", Electronic Letters, IEE Stevenage, GB, vol. 28, No. 4, 1992.

DISTRIBUTED BRAGG REFLECTOR FOR OPTOELECTRONIC DEVICE

CROSS-REFERENCE TO RELATED APPLICATIONS

This application is a division of, and claims priority to, U.S. patent application Ser. No. 10/283,381, filed Oct. 28, 2002 now U.S. Pat. No. 6,990,135, which is incorporated herein by reference in its entirety.

BACKGROUND OF THE INVENTION

1. The Field of the Invention

This invention relates to mirror structures, and more specifically, to mirror structures suitable for use in resonant cavity devices such as vertical cavity surface emitting lasers.

2. Related Technology

Vertical cavity surface emitting lasers (VCSELs) represent a relatively new class of semiconductor lasers. While there are many variations of VCSELs, one common characteristic is that they emit light perpendicular to a wafer's surface. Advantageously, VCSELs can be formed from a wide range of material systems to produce specific characteristics. In particular, the various material systems can be tailored to produce different laser wavelengths, such as 1550 nm, 1310 nm, 850 nm, 670 nm, and so on.

FIG. 1 illustrates a conventional VCSEL device 10. As shown, an n-doped gallium arsenide (GaAs) substrate 12 has an n-type electrical contact 14. An n-doped lower mirror stack 16 (a DBR) is positioned on the GaAs substrate 12, and an n-type lower spacer 18 is disposed over the lower mirror stack 16. An active region 20, usually having a number of quantum wells, is formed over the lower spacer 18. A p-type top spacer 22 is then disposed over the active region 20, and a p-type top mirror stack 24 (another DBR) is disposed over the top spacer 22. Over the top mirror stack 24 is a p-type conduction layer 9, a p-type GaAs cap layer 8, and a p-type electrical contact 26.

Still referring to FIG. 1, the lower spacer 18 and the top spacer 22 separate the lower mirror stack 16 from the top mirror stack 24 such that an optical cavity is formed. As the optical cavity is resonant at specific wavelengths, the mirror separation is controlled to resonate at a predetermined, wavelength (or at a multiple thereof). As shown in FIG. 1, at least part of the top mirror stack 24 may include an annular shaped region 40 that is doped to be non-conductive, typically with a deep H+ implant. The annular shaped region 40 as shown defines a conductive annular central opening 42 that provides an electrically conductive path above a desired region of the active region 20.

During operation, an external bias causes an electrical current 21 to flow from the p-type electrical contact 26 toward the n-type electrical contact 14. The annular shaped region 40, and more specifically, the conductive central opening 42 confine the current 21 such that it flows through the desired region of the active region 20. Some of the carriers in the current 21 are converted into photons in the active region 20. Those photons bounce back and forth (resonate) between the lower mirror stack 16 and the top mirror stack 24. While the lower mirror stack 16 and the top mirror stack 24 are good reflectors, some of the photons escape out as light 23. For top emitting devices, the top mirror 24 may be made slightly less reflective than the bottom mirror 16 to facilitate the escape of photons in an upward direction. After passing through the top mirror 24, the light 23 passes through the p-type conduction layer 9, through the p-type GaAs cap layer 8, through an aperture 30 in the p-type electrical contact 26, and out of the surface of the vertical cavity surface emitting laser 10.

It should be understood that FIG. 1 illustrates a typical VCSEL device, and that numerous variations are possible. For example, the dopings can be changed (say, by providing a p-type substrate 12), different material systems can be used, operational details can be tuned for maximum performance, and additional structures, such as tunnel junctions, can be added, if desired.

Most VCSELs of practical dimensions are inherently multi (transverse) mode. Single lowest-order mode VCSELs are favored for coupling into single-mode fibers, and are advantageous for free-space and/or wavelength sensitive systems, and may even be beneficial for use in extending the bandwidth-length product of standard 50 µm and 62.5 µm GRIN multi-mode fiber. However, it has long been known that, although the short optical cavity (approximately 1λ) of the VCSEL favors single longitudinal mode emission, the multi-wavelength (approximately 10's of λ) lateral dimensions facilitate multi-transverse mode operation.

Higher-order modes typically have a greater lateral concentration of energy away from the center of the lasing cavity. Thus, the one way to force the laser to oscillate in only a lowest-order circularly symmetric mode or a few lower order modes is to make the lateral dimension of the active area small enough to prevent higher-order modes from reaching threshold. However, this necessitates lateral dimensions of less than about 5 µm for typical VCSELs. Such small areas may result in excessive resistance and push the limits obtainable from conventional fabrication methodologies. For example, and referring to FIG. 1, it is often difficult to control the deep H+ implant when forming the annular shaped current confining region 40, particularly when the implantation depth is greater than about 1 µm, where lateral straggle may become a limiting factor. Thus, control of transverse modes remains difficult for VCSELs of practical dimensions.

Rather than using a deep H+ implant to define an annular current confinement region 40, some VCSELs use a high aluminum bearing layer in the top mirror to provide oxide current confinement. Typically, a mesa is formed by etching around the VCSEL device (as taught, for example, in U.S. Pat. No. 5,493,577), after which the high aluminum bearing layer is laterally oxidized from the edge of the mesa to form an annular shaped current confinement region in the VCSEL device. Alternatively, trenches or depressions are formed to access and oxidize the high aluminum bearing layer as taught in U.S. Pat. No. 5,903,588. By controlling the time of oxidization, the size of the annular shaped current confinement region can be controlled. VCSELs fabricated using these methods are often called oxide-confined VCSELs.

While oxide-confined VCSELs are thought to be optically and electrically beneficial, they can be difficult to implement in practice. One reason for the difficulty is that the intentionally oxidized layer, or oxide aperture forming layer, usually has a high aluminum content and is sandwiched between layers having lower aluminum content, which may oxidize at considerably different rates. This can result in significant band discontinuities between the layers. These band discontinuities can detrimentally increase the electrical resistance of the structure and form a barrier to current flow. Attempts have been made to reduce these band discontinuities, but such attempts often result in relatively thick oxide layers due to partial oxidation of the adjacent layers, which can increase the unwanted optical effects of the oxide layer or layers.

Another limitation of many oxide-confined VCSELs is that during the lateral oxidation of the high aluminum oxide aperture forming layer, the other mirror layers that have a lower aluminum concentration are also laterally oxidized to some degree but not to the same degree as the high-aluminum oxide aperture forming layer. It is believed that the lateral oxidation of the aluminum bearing layers creates crystalline defects or the like along the junction between the oxidized region and the non-oxidized region. These crystalline defects are believed to reduce the stability and/or reliability of the device.

BRIEF SUMMARY OF AN EMBODIMENT OF THE INVENTION

The present invention overcomes many of the disadvantages of the prior art by providing an oxide-confined DBR that uses an implant, etch or any other suitable method or process for reducing or eliminating some or all of the electrical artifacts believed to be caused by the junction between oxidized and un-oxidized regions of at least some of the laterally oxidized layers. In some embodiments, this is accomplished by providing an implant that increases the resistivity of selected layers in or around the oxidized and un-oxidized junctions. The increased resistivity may effectively remove the selected oxidized and un-oxidized junctions from contributing to the electrical characteristics of the device. In other embodiments, a patterned etch may be used to remove the selected oxidized and un-oxidized junctions. The selected layers may include, for example, those layers that have a lower aluminum concentration than an oxide aperture forming layer, which will therefore, exhibit a shorter lateral oxidized region than the oxidized aperture forming layer.

BRIEF DESCRIPTION OF THE DRAWINGS

To further clarify the above and other aspects of embodiments of the present invention, a more particular description of the invention will be rendered by reference to specific embodiments thereof which are illustrated in the appended drawings. These drawings depict only typical embodiments of the invention and are therefore not to be considered limiting of its scope. In addition, the drawings are not drawn to scale. The invention will be described and explained with additional specificity and detail through the use of the accompanying drawings in which.

DETAILED DESCRIPTION OF EXEMPLARY EMBODIMENTS OF THE INVENTION

The present invention provides for improved oxide-confined mirror structures suitable for use with VCSELs, RCPDs and/or other optoelectronic devices. Examples of such oxide-confined mirror structures used in conjunction with VCSEL devices are illustrated and their operation is explained with reference to FIGS. 2-10B.

Figure 1:
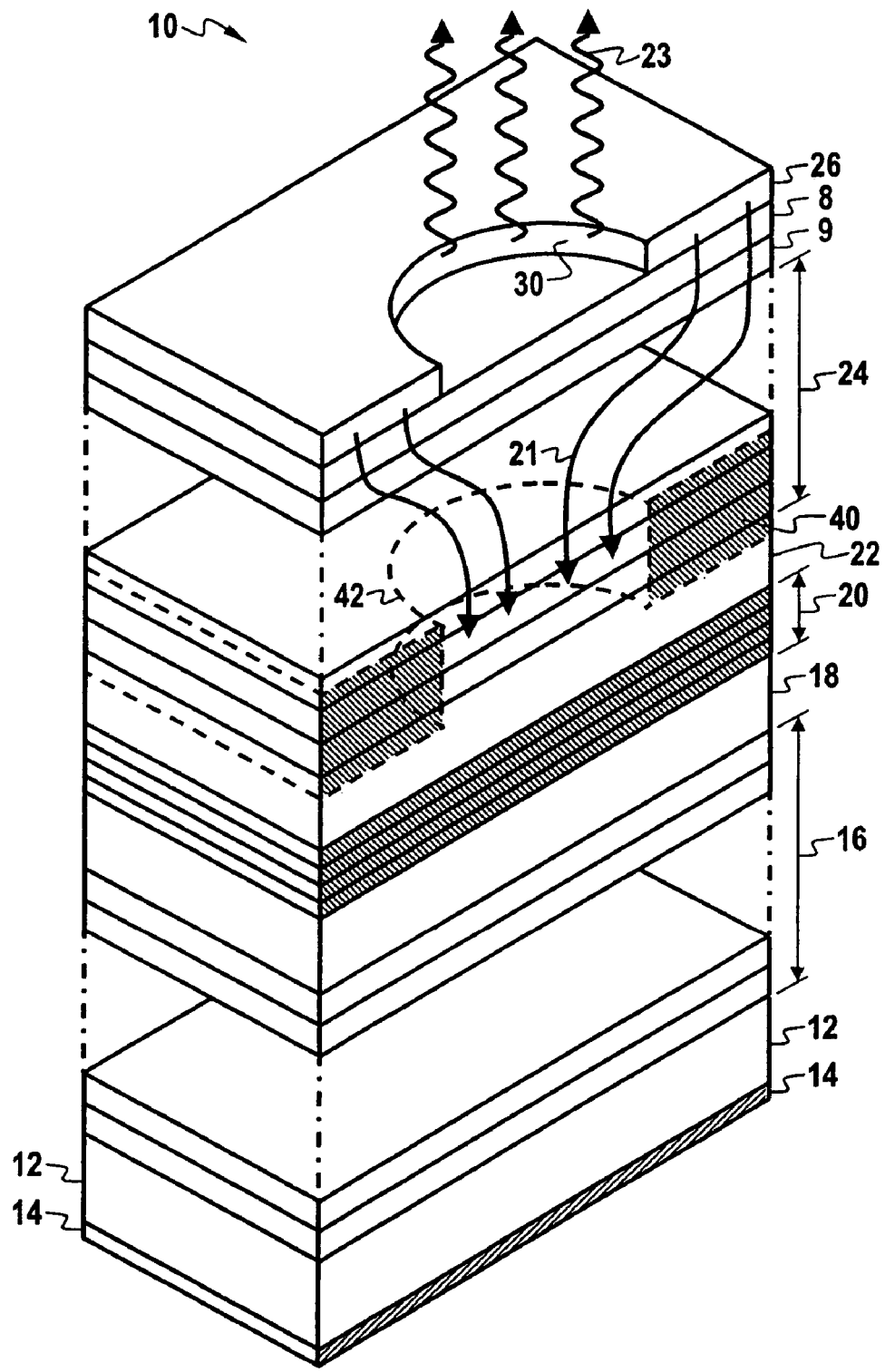
FIG. 1 illustrates a conventional VCSEL device.
Figure 2:
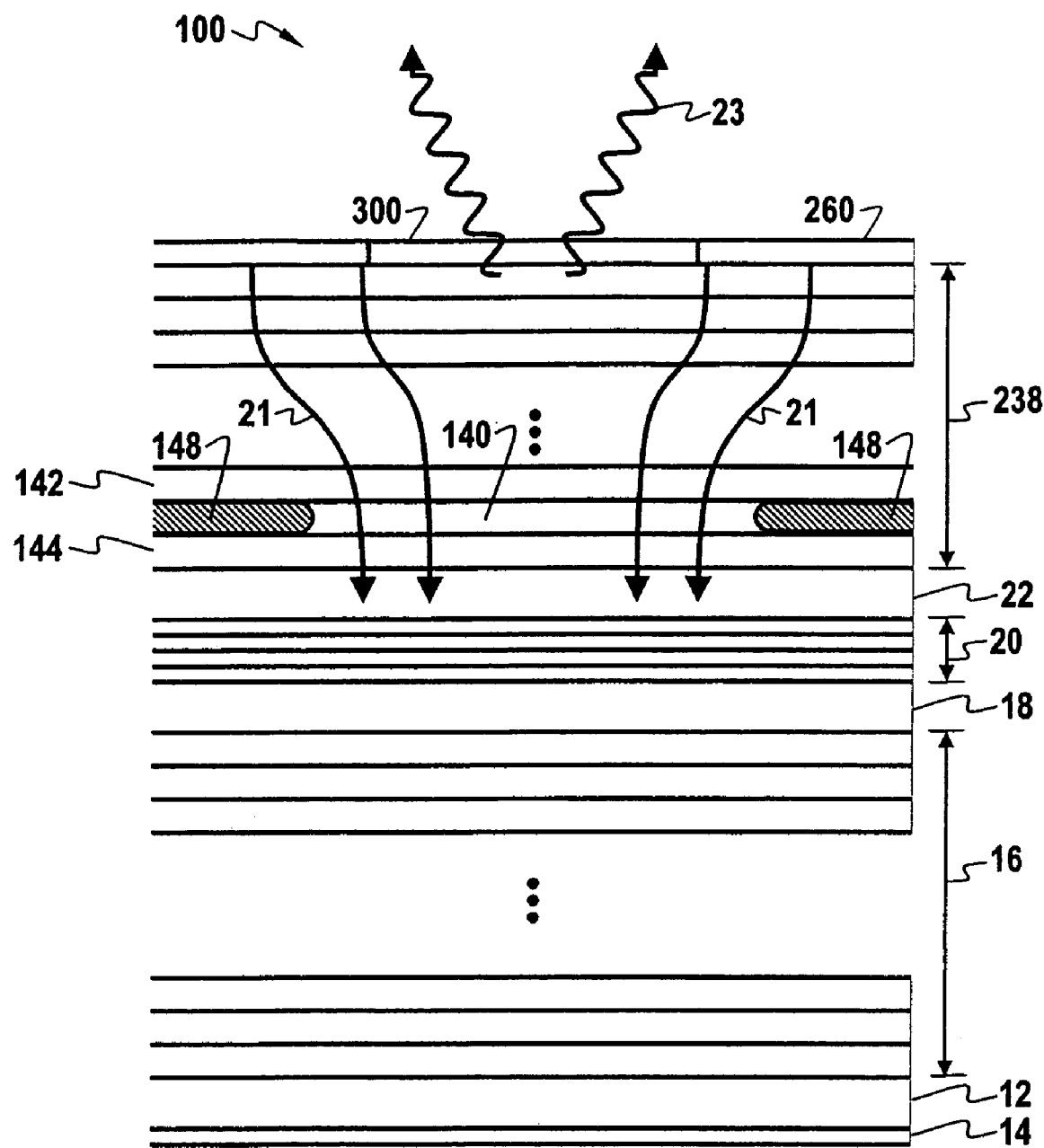
FIG. 2 illustrates a VCSEL device in accordance with one illustrative embodiment of the present invention.

FIG. 2 illustrates a simplified "cut-away" schematic depiction of a VCSEL 100 in accordance with the present invention. As FIG. 2 is an improved version of the VCSEL 10 shown in FIG. 1, the same numbers will be used for similar elements in FIG. 2 as were used in FIG. 1. However, the VCSEL 100 includes an improved upper distributed Bragg reflector (DBR) 238, as further described below.

As shown in FIG. 2, the illustrative VCSEL 100 includes an n-doped gallium arsenide (GaAs) substrate 12 having an n-type electrical contact 14. An n-doped lower mirror stack 16 (a DBR) is positioned on the GaAs substrate 12, and an n-type lower spacer 18 is disposed over the lower mirror stack 16.

An active region 20 having P-N junction structures with at least one but preferably a number of quantum wells is formed over the lower spacer 18. The composition of the active region 20 is preferably AlGaAs, with the specific aluminum content varying in the different layers that form the active region 20. One layer, for example, can have between twenty and thirty percent of aluminum, while an adjacent layer can have between zero and five percent of aluminum. There could be many alternating layers in the active region 20. While an active region using quantum wells is illustrated, it is contemplated that any suitable active region may be used.

On the active region 20 is a p-type top spacer 22. A p-type upper mirror stack 238 (another DBR) is shown disposed over the top spacer 22. The upper mirror stack 238 is described in more detail below.

In the illustrative embodiment, a p-type conduction layer, a p-type GaAs cap layer, and a p-type electrical contact, collectively designated as 260, are provided over the upper mirror stack 238. As in the VCSEL 10 (see FIG. 1), the lower spacer 18 and the top spacer 22 may be used to separate the lower mirror stack 16 from the upper mirror stack 238 such that an optical cavity that is resonant at a specific wavelength is formed.

Figure 3:
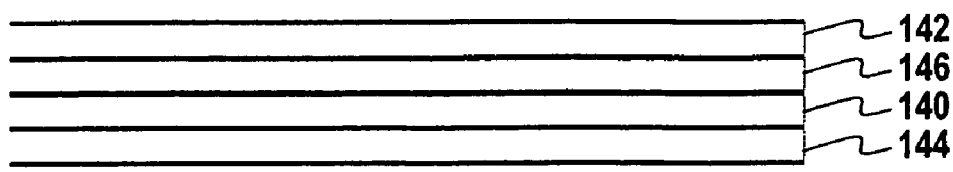
FIG. 3 is a cross-sectional view of an illustrative DBR used in the VCSEL device of FIG. 2.

Referring now to FIGS. 2 and 3, the upper mirror stack 238 may include a layer that includes a heavily doped oxide aperture forming layer 140. The oxide aperture forming layer 140 preferably has a relatively high Al content (e.g. over 95%, and beneficially about 98%) to facilitate lateral oxidation as further described below. The oxide aperture forming layer 140 is disposed between a first layer 142, which has a comparatively lower Al content, (e.g. between 0% and 35%, and beneficially about 15%), and a second layer 144, which has a comparatively medium Al content (e.g. around 65%, but preferably less than 85%). The oxide aperture forming layer 140 may be disposed at or near a null or a node of the optical electric field produced by resonant light (described in more detail subsequently with reference to FIG. 6), but this is not required in all embodiments.

Referring now specifically to FIG. 3, a transition layer or region 146 is provided between the first layer 142 and the oxide aperture forming layer 140. In the illustrative embodiment, the transition layer 146 is a relatively thin layer that is about 20 nanometers thick and includes a change in Al concentration across its thickness that varies substantially linearly (described in more detail subsequently with reference to FIG. 4). However, other configurations and compositions may also be used. The second layer 144 and the oxide aperture forming layer 140 may abut, as shown.

Figure 4:
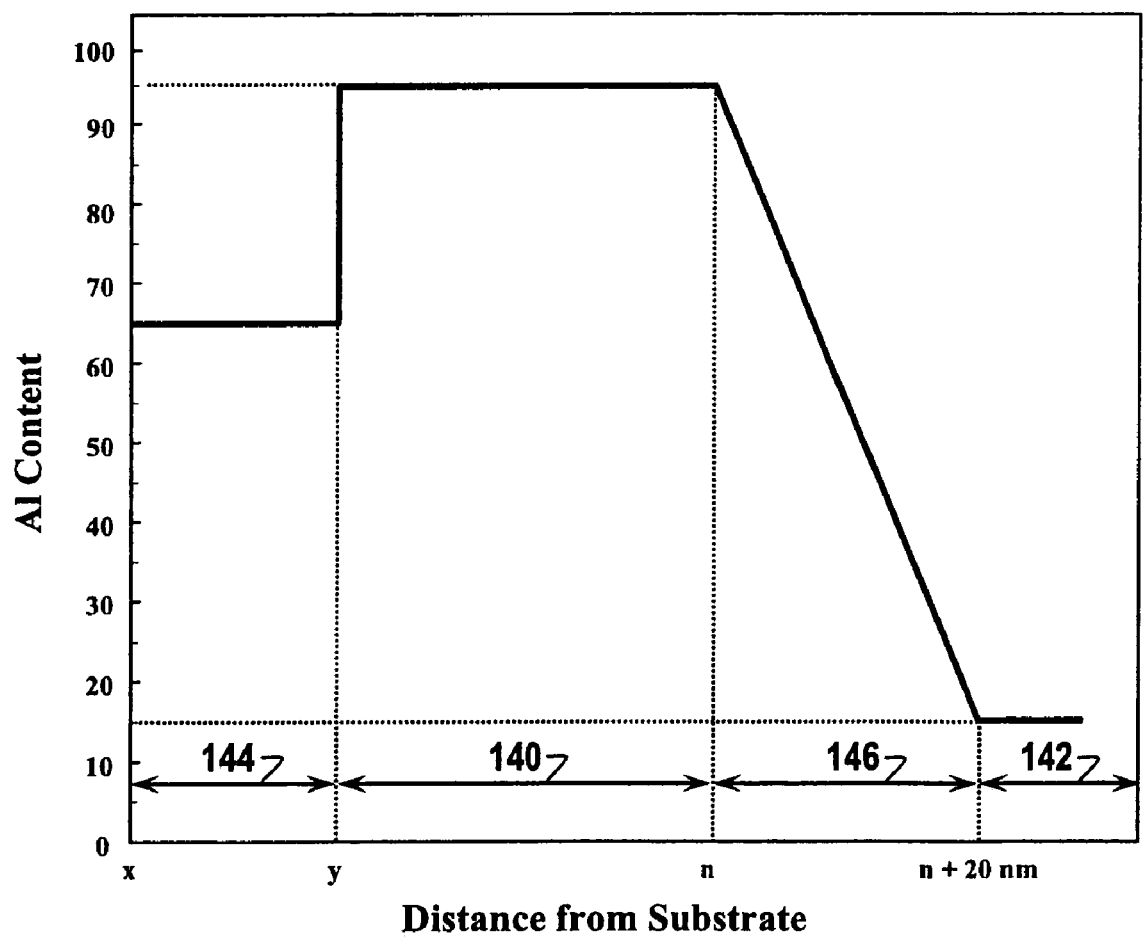
FIG. 4 is a graph that shows the Al concentration of a section of an illustrative DBR used in the VCSEL device of FIG. 2.

FIG. 4 shows the aluminum concentration of the second layer 144, the oxide aperture forming layer 140, the transition layer or region 146, and the first layer 142 in accordance with one illustrative embodiment of the present invention. At some distance x from the substrate 12, the second layer 144, having an Al content of beneficially 65%, begins. At a distance y, a step change in the Al content occurs where the oxide aperture forming layer 140 starts. As noted above, the oxide aperture forming layer 140 may have a Al content of, for example, greater than 95% and more preferably about 98%. Then, at some distance n, the transition region 146 begins. Over a distance of about 20 nanometers in the illustrative embodiment, the Al content of the transition region 146 drops from that of the oxide aperture forming layer 140 (e.g. about 98%) to about 15%, which is the Al content of the first layer 142 in the illustrative embodiment. At a distance of n+20 nanometers the first layer 142 begins.

Figure 5:
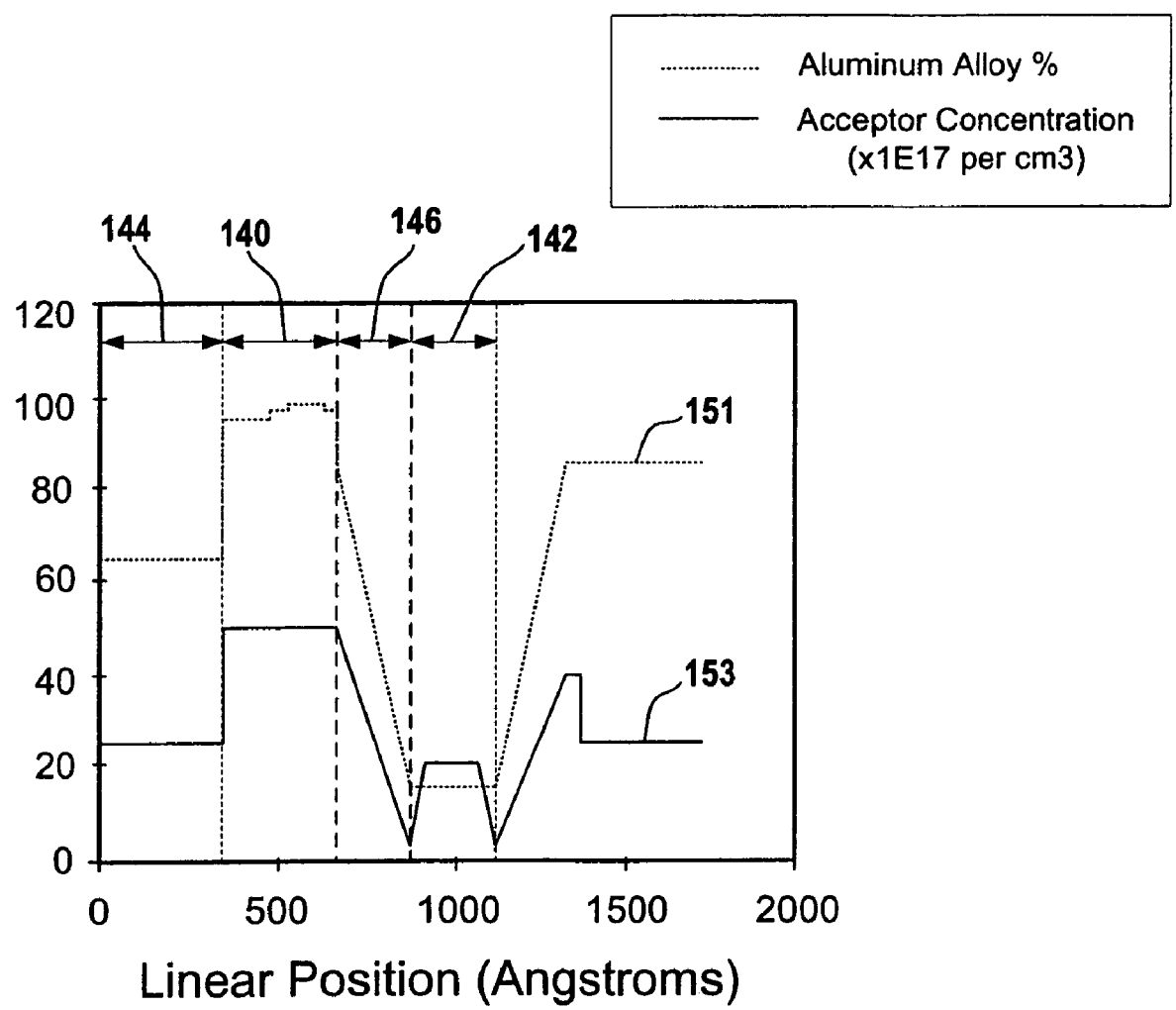
FIG. 5 is a graph that shows the Al concentration and acceptor concentration of a section of an illustrative DBR used in the VCSEL device of FIG. 2.

FIG. 5 shows the aluminum concentration and acceptor concentration of the second layer 144, the oxide aperture forming layer 140, the transition layer or region 146, and the first layer 142 in accordance with another illustrative embodiment of the ap; present invention. As can be seen, the second layer 144 has an Al content of about 65% and an acceptor concentration of about 2.2E18 atoms/cm$^3$. The oxide aperture forming layer 140 has a Al content of about 98% and is doped with an acceptor concentration of about 5E18 atoms/cm$^3$. Following the oxide aperture forming layer 140 is the transition layer or region 146. The transition layer or region 146 is AlGaAs with a thickness of about 20 angstroms, and has an Al content that begins at about 90%, before dropping in a linear manner to about 15%, which is the Al content of the first layer 142. The acceptor concentration of the transition layer or region 146 drops from about that of the oxide aperture forming layer 140 (e.g. about 5E18 atoms/cm$^3$) to about 5E17 atoms/cm$^3$. The first layer 142 has a relatively constant Al content of about 15%, and an acceptor concentration that ramps up from about 5E17 atoms/cm$^3$ to 2E18 atoms/cm$^3$ before falling back to about 5E17 atoms/cm$^3$, as shown.

While the illustrative embodiment detailed in FIGS. 4 and 5 includes a transition region 146 with a thickness of 20 nanometers, it is contemplated that any thickness may be used. In a preferred embodiment, the thickness of the transition region 146 is between about 10 to 50 nanometers, and more beneficially about 20 nanometers, but this is not required in all embodiments. For thinner transition regions, higher acceptor doping concentrations may be desirable, while for thicker transition regions, lower acceptor doping concentrations may be desirable. A thicker transition region will typically result in a thicker oxide layer along the oxide aperture forming layer 140, which in some cases, may be less desirable.

In addition, the Al concentration and acceptor concentration are shown varying substantially linearly across the thickness of the transition region 146. It is contemplated, however, that non-linear ramps may be used including, for example, exponential ramps such as parabolic ramps. In some cases, non-linear ramps, or even discontinuous ramps, may provide a more optimal profile.

Referring now once again to FIG. 2, oxide aperture forming layer 140 of the upper mirror stack 238 can include an oxide insulating region 148. In the illustrative embodiment, the insulating region may be produced by oxidizing the oxide aperture forming layer 140 from a lateral edge of the upper mirror stack 238 to form an annular ring. A trench, several trenches or holes may be etched around at least part of the periphery of the VCSEL 100 to facilitate the lateral oxidation of the oxide aperture forming layer 140, as taught in U.S. Pat. No. 5,903,588, which is incorporated in its entirety by reference.

In operation, an external bias is applied which causes an electrical current 21 to flow from the p-type electrical contact 260, through the p-type upper mirror stack 238 including the first layer 142, the transition layer or region 146, the un-oxidized region of the oxide aperture forming layer 140 (i.e., the area that is not shaded), the second layer 144, the p-type top spacer 22, the active region 20, the n-type lower spacer 18, the n-type lower mirror stack 16, the n-doped GaAs substrate 12 and to the n-type electrical contact 14. Some of the current that flows through the active region 20 produces photons, which as described above, reflect between the p-type upper mirror stack 238 and the n-type lower mirror stack 16. In the illustrative embodiment shown, the p-type upper mirror stack 238 may be made slightly less reflective than the n-type lower mirror stack 16 to allow more of the light 23 to exit the top of the VCSEL 100, as shown. However, other configurations are also contemplated. For example, for a bottom emitting VCSEL, the n-type lower mirror stack 16 may be made slightly less reflective than the p-type upper mirror stack 238 to allow more of the light to exit the bottom of the VCSEL 100.

The threshold of the VCSEL 100 is dependent upon the resistance of the upper mirror stack 238 primarily because of free carrier absorption. Because the oxide aperture forming layer 140 includes a significantly higher concentration of aluminum than the first layer 142, there may be a significant band discontinuity between the first layer 142 and the oxide aperture forming layer 140, which may provide an energy barrier that increases the effective resistance of the upper mirror stack 238 through to the active region 20. To help reduce the effect of this band discontinuity, the present invention contemplates providing transition layer or region 146 between the first layer 142 and the oxide aperture forming layer 140.

As noted above, the transition layer or region 146 preferably is about 20 nanometers thick and includes a change in Al concentration across its thickness that varies substantially linear from at or near the Al concentration of the oxide aperture forming layer 140 to at or near the Al concentration of the first layer 142. This helps smooth out the band discontinuity between the first layer 142 and the oxide aperture forming layer 140. In addition, the oxide aperture forming layer 140 is preferably heavily p-doped (e.g. greater than 1E18 atoms/cm$^3$, more beneficially 5E18 atoms/cm$^3$). The heavy doping of the oxide aperture forming layer 140 may help alter the valance band energy barrier introduced by the oxide aperture forming layer 140, which may help reduce the band discontinuity between the first layer 142 and the oxide aperture forming layer 140. The reduction of the valance band energy barrier with doping level of the oxide aperture forming layer 140 is illustrated in FIG. 7.

Figure 7:
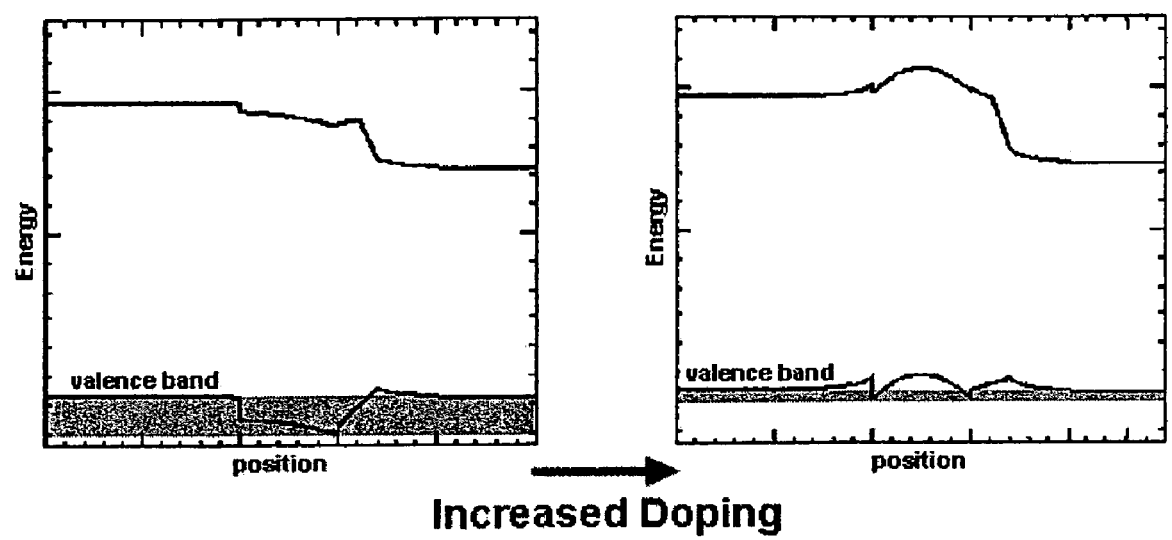
FIG. 7 shows two graphs that illustrate the reduction in the valance band energy barrier of the oxide aperture forming layer 140 versus doping level.

The graph on the left of FIG. 7 shows the valance band energy of the oxide aperture forming layer 140 with little or no doping, while the graph on the right shows the reduced valance band energy of the oxide aperture forming layer 140 with increased doping. The heavy doping level of the oxide aperture forming layer 140 may also help compositional ramp of the transition region 146 may also help reduce the electrical resistance of the upper mirror stack 238. It is recognized that a transition layer or region may not be necessary between the oxide aperture forming layer 140 and the second layer 144 because the band discontinuity in this direction is a diode with forward current flow in a downward direction toward the active region 20. The heavy doping of layer 140 reduces the forward drop of this diode. However, such a transition layer or region may be provided if desired. This technique of using a direct drop of composition with heavy doping at the forward biased diodes at or near a null of the electric field may be used in other layers of the DBR to improve thermal conductivity by avoiding ramps of ternary materials.

Figure 6:
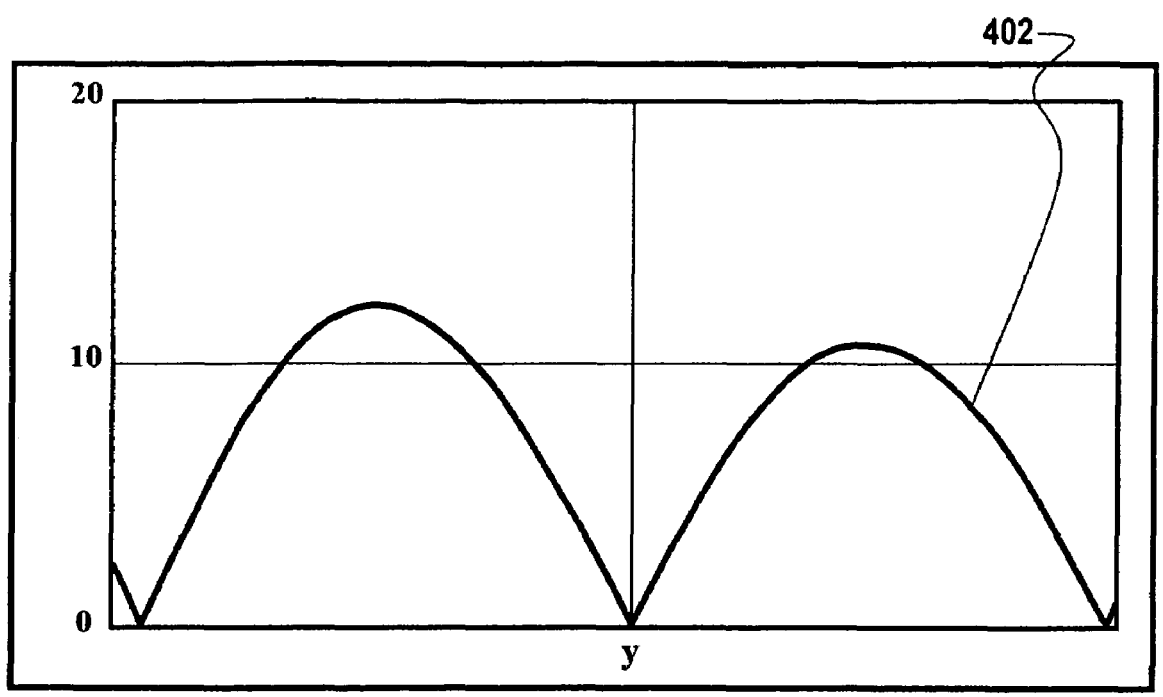
FIG. 6 is a graph showing an illustrative optical standing wave in the DBR of FIG. 2.

FIG. 6 illustrates the absolute value of an optical electric field 402 of a standing wave developed within the upper mirror stack 238. As shown, the optical electric field 402 is very low near position y of FIG. 6 (possibly becoming zero in the center of the oxide aperture forming layer 140). The oxide aperture forming layer 140 is preferably positioned at or near position y (i.e., a null of the optical electric field), which may help reduce the optical absorption of the oxide aperture forming layer 140. However, in some embodiments, the oxide aperture forming layer 140 may be positioned at or near a node of the optical electric field or somewhere in between, depending on the application.

As noted above, another limitation of many oxide-confined VCSELs is that during the lateral oxidation of the high aluminum oxide aperture forming layer 140, the other mirror layers that have a lower aluminum concentration are also laterally oxidized to some degree (usually unintentionally). It is believed that the lateral oxidation of the aluminum bearing layers creates crystalline defects or the like along the junction between the oxidized region and the non-oxidized region. These crystalline defects are believed to reduce the stability and/or reliability of the device.

Figure 8:
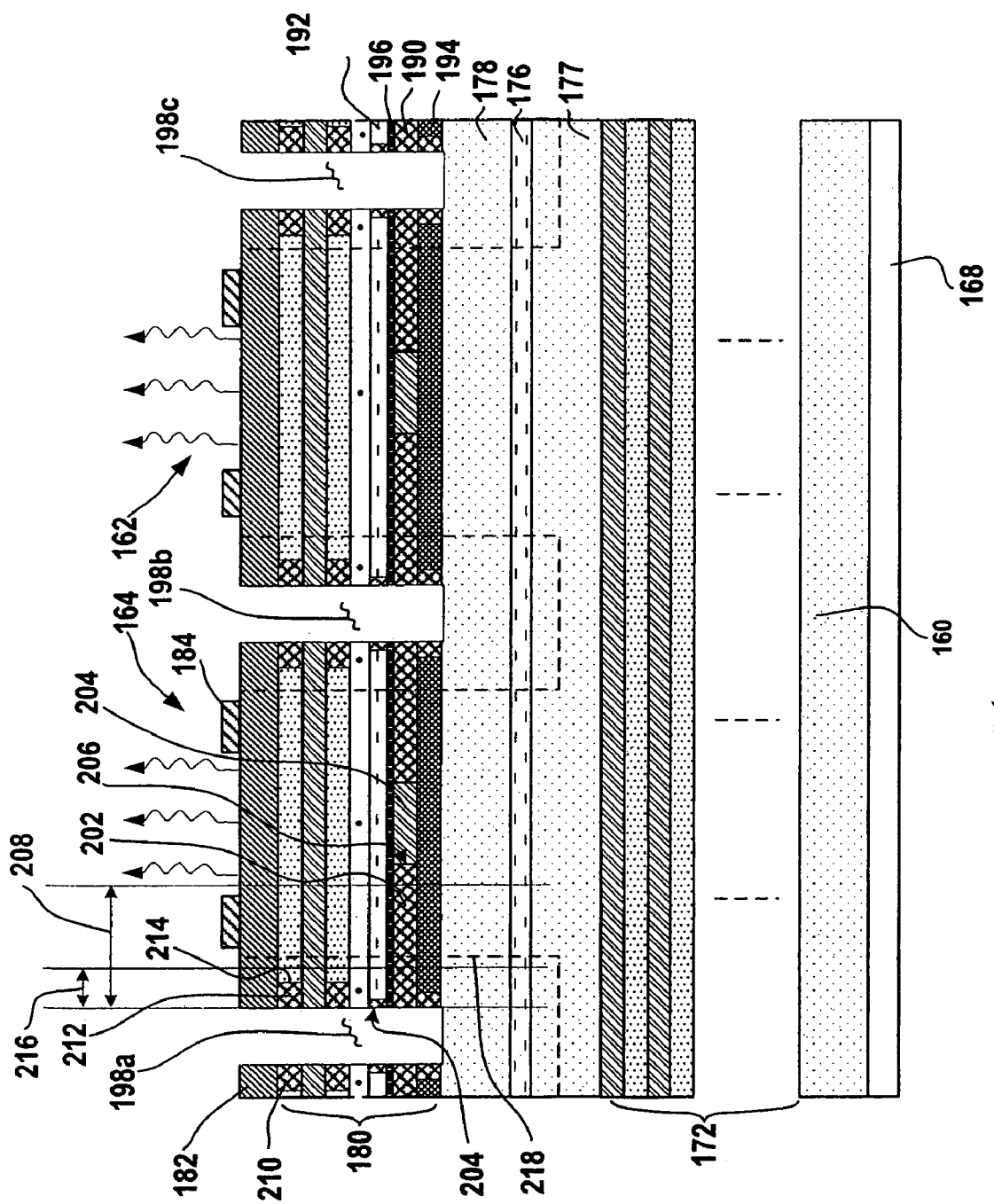
FIG. 8 is a cross-sectional side view of an illustrative VCSEL which includes an implant for reducing or eliminating some or all of the electrical artifacts believed to be caused by the junction between the oxidized and non-oxidized regions of a laterally oxidized DBR.

FIG. 8 is a cross-sectional side view of an illustrative VCSEL which includes an implant for reducing or eliminating some or all of the electrical artifacts believed to be caused by the junction between the oxidized and non-oxidized regions of a laterally oxidized DBR. A wafer substrate 160 is shown, with an exemplary number of two VCSELs 162 and 164 positioned adjacent to one another. The illustrative VCSELs 162 and 164 are formed on an n-doped gallium arsenide (GaAs) substrate 160 having an n-type electrical contact 168. An n-doped lower mirror stack 172 (a DBR) is positioned on the GaAs substrate 160, and an n-type lower spacer 177 is disposed over the lower mirror stack 172.

An active region 176 having P-N junction structure with at least one but preferably a number of quantum wells is formed over the lower spacer 177. The composition of the active region 176 is preferably AlGaAs, with the specific aluminum content varying in the different layers that form the active region 176. One layer, for example, may have between twenty and thirty percent of aluminum, while an adjacent layer might have between zero and five percent of aluminum. There could be many alternating layers in the active region 176. While an active region using a quantum well structure is illustrated, it is contemplated that any suitable active region may be used.

On the active region 176 is a p-type top spacer 178. A p-type top mirror stack 180 (another DBR) is shown disposed over the top spacer 178. The upper mirror stack 180 is preferably similar to that described above with respect to FIGS. 2-7. That is, an oxide aperture forming layer 190 (analogous to oxide aperture forming layer 140) is provided between a first layer 192 (analogous to first layer 142) and a second layer 194 (analogous to second layer 144). A transition layer or region 196 can be provided between the first layer 192 and the oxide aperture forming layer 190, as described above.

In the illustrative embodiment, a p-type conduction layer and a p-type GaAs cap layer, collectively shown at 182, may be provided over the top mirror stack 180. A p-type electrical contact layer 184 may then be provided for making electrical contact to the VCSELs 162 and 164.

To produce oxide-confined VCSELs, a trench, several trenches or holes may be etched around at least part of the periphery of each VCSEL 162 and 164 to facilitate the lateral oxidation of the oxide aperture forming layer 190. In FIG. 8, the illustrative trenches are shown at 198a, 198b and 198c. Some illustrative trench and hole configurations are shown in FIGS. 9A-9D. The trenches 198a, 198b and 198c of FIG. 8 extend down to the oxide aperture forming layer 190, but preferably do not extend down into the active region 176 as shown in FIG. 8, but this is not required in all embodiments. As can be seen, many configurations are possible as will become apparent to those skilled in the art.

With the trenches 198a, 198b and 198c in place, the wafer is exposed to an oxidizing environment. The oxidizing environment oxidizes any layers that are exposed by the trenches 198a, 198b and 198c and have a concentration of oxidizable material, such as aluminum. The lateral distance that the each of the layers is oxidized is dependent on the concentration of the oxidizable material contained in the layer. Thus, in the illustrative embodiment, the oxide aperture forming layer 190, which has a relatively high aluminum concentration, oxidizes at a much greater rate and thus a much further distance into the DBR than the other exposed aluminum bearing layers of the DBR 180. In one example, the oxide aperture forming layer 190 oxidizes two to fifteen times the distance into the DBR than the other exposed aluminum bearing layers of the DBR 180, more preferably about 10 times or more. In some cases, high oxidation distance contrast ratios are selected to help minimize any mechanical stress in the active optical aperture of the device. It is recognized, however, that any suitable oxidation distance contrast ratio may be selected, depending on the application.

Referring specifically to FIG. 8, the oxide aperture forming layer 190 of DBR 180 includes an oxidized region 202 that extends from the edge 204 of the trench 198a to an oxide termination junction 206 that is situated greater than a first distance 208 from the edge 204 of the trench 198a. It is contemplated that in some embodiments, there may be more than one oxide aperture forming layer, as desired.

The other aluminum bearing layers, such as the AlGaAs layers of the DBR 180, are also (unintentionally) laterally oxidized by the oxidizing environment, but to a lesser extent. For example, AlGaAs layer 210 includes an oxidized region 212 that extends from the edge 204 of the trench 198a to an oxide termination junction 214 that is situated less than a second distance 216 from the edge 204 of the trench 198a. Note that the first distance 208 is greater than the second distance 216.

It is believed that the lateral oxidation of the aluminum bearing layers can create crystalline defects or the like along the oxide termination junction, such as oxide termination junction 214 between the oxidized region and the non-oxidized region. These crystalline defects are believed to contribute to the reduction of the stability and/or reliability of the device. For instance, the crystalline defects are believed to cause mechanical stress at the oxide termination junctions, which under some circumstances, can propagate through the device over time. Differences in thermal expansion of the oxidized material and the non-oxidized material can further increase the mechanical stress within the device, which may further help propagate defects such as dark lines into the semiconductor material of the device. It is believed that these may contribute to an increase in the infant mortality rate and a reduction in the long term reliability of the device.

An implant, etch or any other suitable method or process may be used to reduce or eliminate some or all of the electrical artifacts associated with the oxide termination junctions. For example, in FIG. 8, a patterned implant shown generally by dotted line 218 is provided to isolate the oxide termination junctions of the AlGaAs aluminum bearing layers of the DBR 180 from the active current aperture of the device. In the illustrative embodiment, the implant 218 is preferably a proton implant (H+) that extends from at least the edge 204 of the trench 198a to a location beyond the second distance 216, but not as far as the first distance 208, but this is not required in all embodiments. In some embodiments, for example, the implant 218 may only extend across a region that encompasses the oxide termination junctions of concern. In yet another illustrative embodiment, the implant 218 may extend along a region that resides entirely between the second distance 216 and the first distance 208. To help electrically isolate adjacent VCSELs on the wafer, the implant 218 can extend down past the active region 176 as shown in FIG. 8, but this is not required in all embodiments.

Preferably, the implant 218 renders the affected material non-conductive or at least more resistive, which may help electrically isolate the oxide termination junctions of the AlGaAs layers (but preferably not the oxide aperture forming layer 190) from the active current aperture of the device. It is contemplated that any suitable implant may be used, including a proton implant, a helium implant, an implant of an electrically active impurity such as silicon, germanium, beryllium, etc., and/or any other process or method that disrupts the conductivity of the material so as to reduce or eliminate one or more electrical artifacts related to the oxide termination junctions from adversely affecting the operation of the device. The implant 218 may further provide an implant interface that is relatively stress free to help guide the recombination current through the active current aperture of the device. The same or similar implants may be used in and around trenches 198b and 198c, as shown in FIG. 8. It is contemplated that the trenches 198a, 198b and 198c may be left open, or filled with an insulating or other material either before or after the implant, as desired.

It is believed that the implant 218 may be used to help prevent the propagation of defects from and separates the mechanical stress from the oxide termination junctions of the AlGaAs layers into the active current aperture of the device. It is also believed that the implant 218 may help reduce the potential for recombination to occur at or near the stress points and/or defects caused by the oxide termination junctions of the AlGaAs layers. This is particularly important near the active region 176, where a vast majority of the carriers recombine during the operation of the device. In some embodiments, and as shown in FIG. 8, trenches 198a, 198b and 198c may not extend all the way down to the active region 176, which may further as help isolate the active region 176 from the mechanical stress points and/or defects caused by the oxide termination junctions.

In addition, or alternatively, it is contemplated that a relief etch followed by an implant may be used to help isolate adjacent devices. For example, when a shallow implant cannot penetrate a sufficient or desired distance into or through the top DBR mirror 180, it is contemplated that a relief etch, such as relief etch 198a, 198b and 198c, may be provided into or through the top DBR to help reduce the thickness of the top DBR mirror 180. With the reduced thickness, the shallow implant can then penetrate a sufficient or desired distance into or through the top DBR mirror 180, as desired. Such an etch and implant may be used in helping to isolate laterally oxidized devices, as described above, as well as non-laterally oxidized devices (e.g. implant isolated devices), as desired.

Figure 9A:
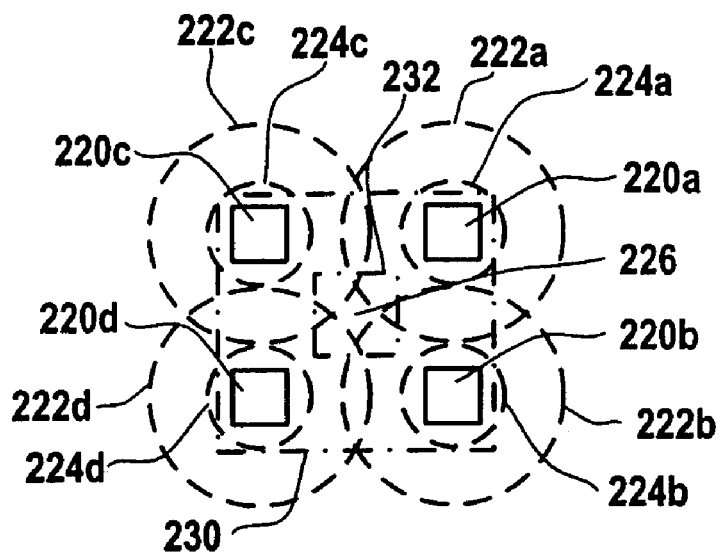
FIGS. 9A-9D are schematic top view diagrams showing a number of illustrative embodiments for reducing or eliminating some or all of the electrical artifacts believed to be caused by the junction between the oxidized and non-oxidized regions of a laterally oxidized DBR.

FIGS. 9A-9D are schematic top view diagrams showing a number of illustrative embodiments for reducing or eliminating some or all of the electrical artifacts believed to be caused by the oxide termination junctions between the oxidized and non-oxidized regions of a laterally oxidized DBR. In FIG. 9A, three or four boles 220a, 220b, 220c and 220d are etched into the top DBR 180 of FIG. 8 to expose the oxide aperture forming layer 190. The device is then exposed to an oxidizing environment, which causes the oxide aperture forming layer 190 to laterally oxidize beyond the first distance 208. At the same time, the exposed aluminum bearing AlGaAs layers of the DBR 180 also laterally oxidize, preferably to less than a second distance 216 from the edge 204 of the trench 198a. In the illustrative embodiment shown in FIG. 9A, the extent of oxidization of the oxide aperture forming layer 190 from holes 220a, 220b, 220c and 220d is shown by dashed lines 222a, 222b, 222c and 222d, respectively. The conductive VCSEL aperture defined by the termination of the oxidation layer corresponds to region 226. The extent of oxidization of the aluminum bearing AlGaAs DBR layers from holes 220a, 220b, 220c and 220d is shown by dashed lines 224a, 224b, 224c and 224d, respectively, which corresponds to the oxide termination junctions of the AlGaAs aluminum bearing layers of the DBR 180.

An implant can then be provided to help isolate the oxide termination junctions of the AlGaAs aluminum bearing layers of the DBR 180 from the conductive VCSEL aperture 226. In the illustrative embodiment, the implant can be provided in the region between the dot-dashed lines 230 and 232. However, in some embodiments, the outer dot-dashed line 230 may not be provided. In this embodiment, the implant would extend across the entire wafer or device except inside the dot-dashed line 232.

Figure 9B:
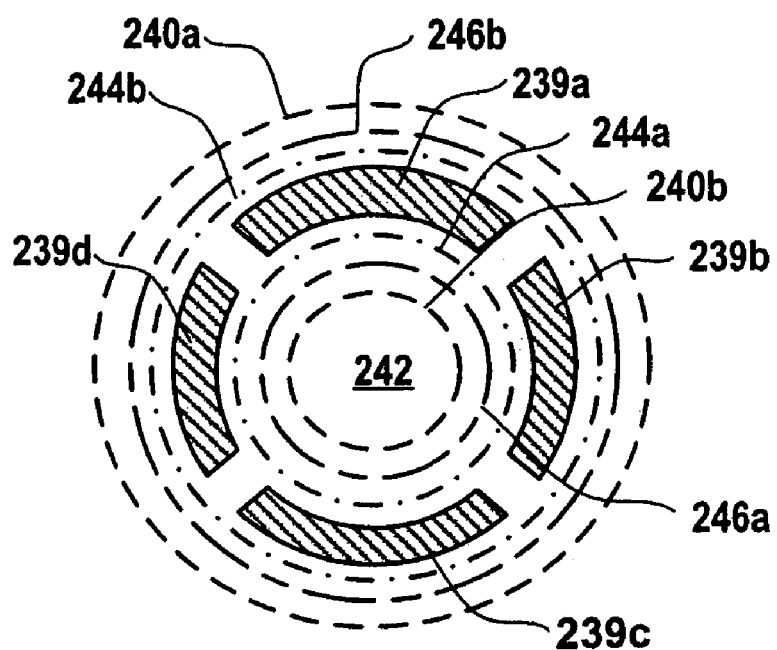

In another illustrative embodiment, and as shown in FIG. 9B, a number of trenches 239a, 239b, 239c and 239d may be etched into the upper DBR 180 of FIG. 8 to expose the oxide aperture forming layer 190. The wafer is then exposed to an oxidizing environment, which causes the oxide aperture forming layer 190 to laterally oxidize beyond the first distance 208 (Not shown in 8B). At the same time, the other aluminum bearing AlGaAs DBR layers laterally oxidize, preferably to less than a second distance 216 from the edge 204 of the trench 198a. In the illustrative embodiment shown in FIG. 9B, the extent of oxidization of the oxide aperture forming layer 190 from trenches 239a, 239b, 239c and 239d is shown by dashed lines 240a and 240b. The conductive VCSEL aperture is defined by region 242. The extent of oxidization of the aluminum bearing AlGaAs DBR layers from trenches 239a, 239b, 239c and 239d is shown by dot-dashed lines 244a and 244b, which corresponds to the oxide termination junctions of the AlGaAs aluminum bearing layers of the DBR 180.

An implant can be provided to help isolate the oxide termination junctions of the AlGaAs aluminum bearing layers of the DBR 180 from the conductive VCSEL aperture 242. In the illustrative embodiment, the implant can be provided in the region between the dot-dashed lines 246a and 246b. However, in some embodiments, the outer dot-dashed line 246b may not be provided. In this embodiment, the implant would extend across the entire wafer or device except inside the dot-dashed line 246a.

Figure 9C:
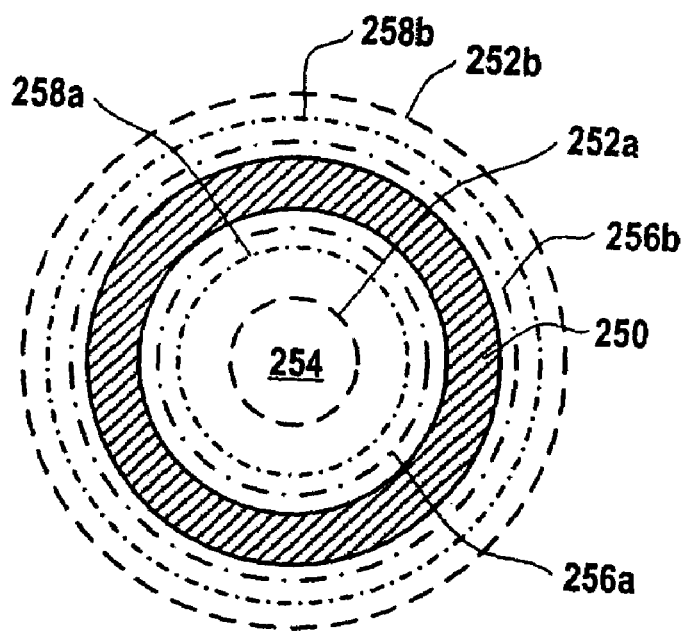

In yet another illustrative embodiment, and as shown in FIG. 9C, a single annular trench 250 can be etched into the top DBR 180 of FIG. 8 to expose the oxide aperture forming layer 190. The wafer is then exposed to an oxidizing environment, which causes the oxide aperture forming layer 190 to laterally oxidize beyond the first distance 208. At the same time, the other aluminum bearing AlGaAs DBR layers laterally oxidize, preferably to less than a second distance 216 from the edge 204 of the trench 198a. In the illustrative embodiment, the extent of oxidization of the oxide aperture forming layer 190 from annular trench 250 is shown by dashed lines 252a and 252b. The conductive VCSEL aperture defined by the oxide aperture forming layer is shown at 254. The extent of oxidization of the aluminum bearing AlGaAs DBR layers from annular trench 250 is shown by dot-dashed lines 256a and 256b, which corresponds to the oxide termination junctions of the AlGaAs aluminum bearing layers of the DBR 180.

An implant can be provided to help isolate the oxide termination junctions of the AlGaAs aluminum bearing layers of the DBR 180 from the conductive VCSEL aperture 254. In the illustrative embodiment, the implant can be confined to the region defined between the dot-dashed lines 258a and 258b. However, in some embodiments, the outer dot-dashed line 258b may not be provided. In this embodiment, the implant would extend across the entire wafer or device except inside the dot-dashed line 258a. Rather than providing an annular trench 250 as shown, it is contemplated that a mesa may be formed, if desired.

Figure 9D:
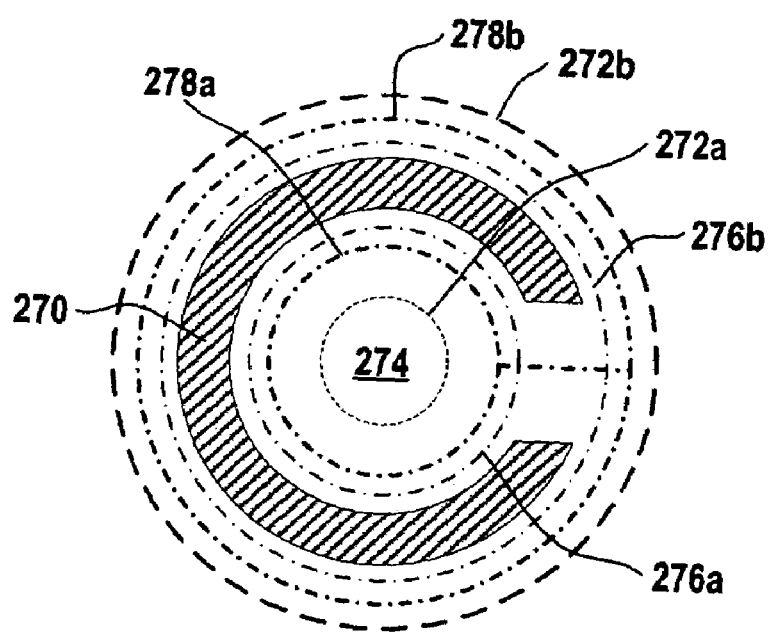

In yet another illustrative embodiment, and as shown in FIG. 9D, a C-shaped trench 270 can be etched into the top DBR 180 of FIG. 8 to expose the oxide aperture forming layer 190. The wafer is then exposed to an oxidizing environment, which causes the oxide aperture forming layer 190 to laterally oxidize beyond the first distance 208. At the same time, the other aluminum bearing AlGaAs DBR layers laterally oxidize, preferably to less than a second distance 216 from the edge 204 of the trench 198a. In the illustrative embodiment, the extent of oxidization of the oxide aperture forming layer 190 from C-shaped trench 270 is shown by dashed lines 272a and 272b. The conductive VCSEL aperture defined by the oxide aperture forming layer is shown at 274. The extent of oxidization of the aluminum bearing AlGaAs DBR layers from annular trench 270 is shown by dot-dashed lines 276a and 276b, which corresponds to the oxide termination junctions of the AlGaAs aluminum bearing layers of the DBR 180. As can be seen, and in the illustrative embodiment, the aluminum bearing AlGaAs DBR layers laterally oxidize to fill the space between the ends of the C-shaped trench 270.

An implant can be provided to help isolate the oxide termination junctions of the AlGaAs aluminum bearing layers of the DBR 180 from the conductive VCSEL aperture 274. In the illustrative embodiment, the implant can be confined to the region defined between the dot-dashed lines 278a and 278b. However, in some embodiments, the outer dot-dashed line 278b may not be provided. In this embodiment, the implant would extend across the entire wafer or device except inside the dot-dashed line 278a.

Figure 10A:
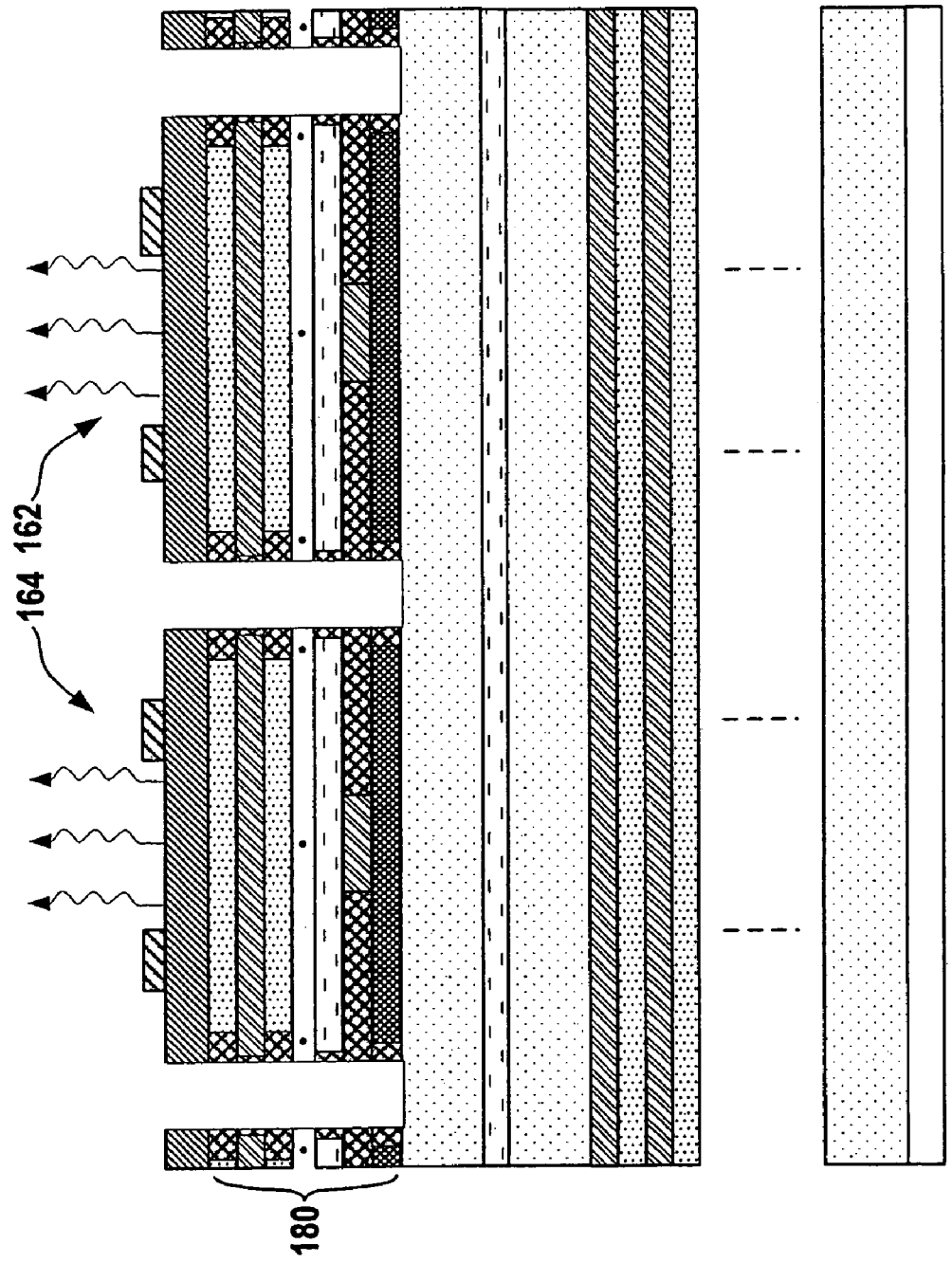
FIGS. 10A-10B are cross-sectional side views of another illustrative VCSEL which includes an etch for reducing or eliminating some or all of the electrical artifacts believed to be caused by the junction between the oxidized and non-oxidized regions of a laterally oxidized DBR.
Figure 10B:
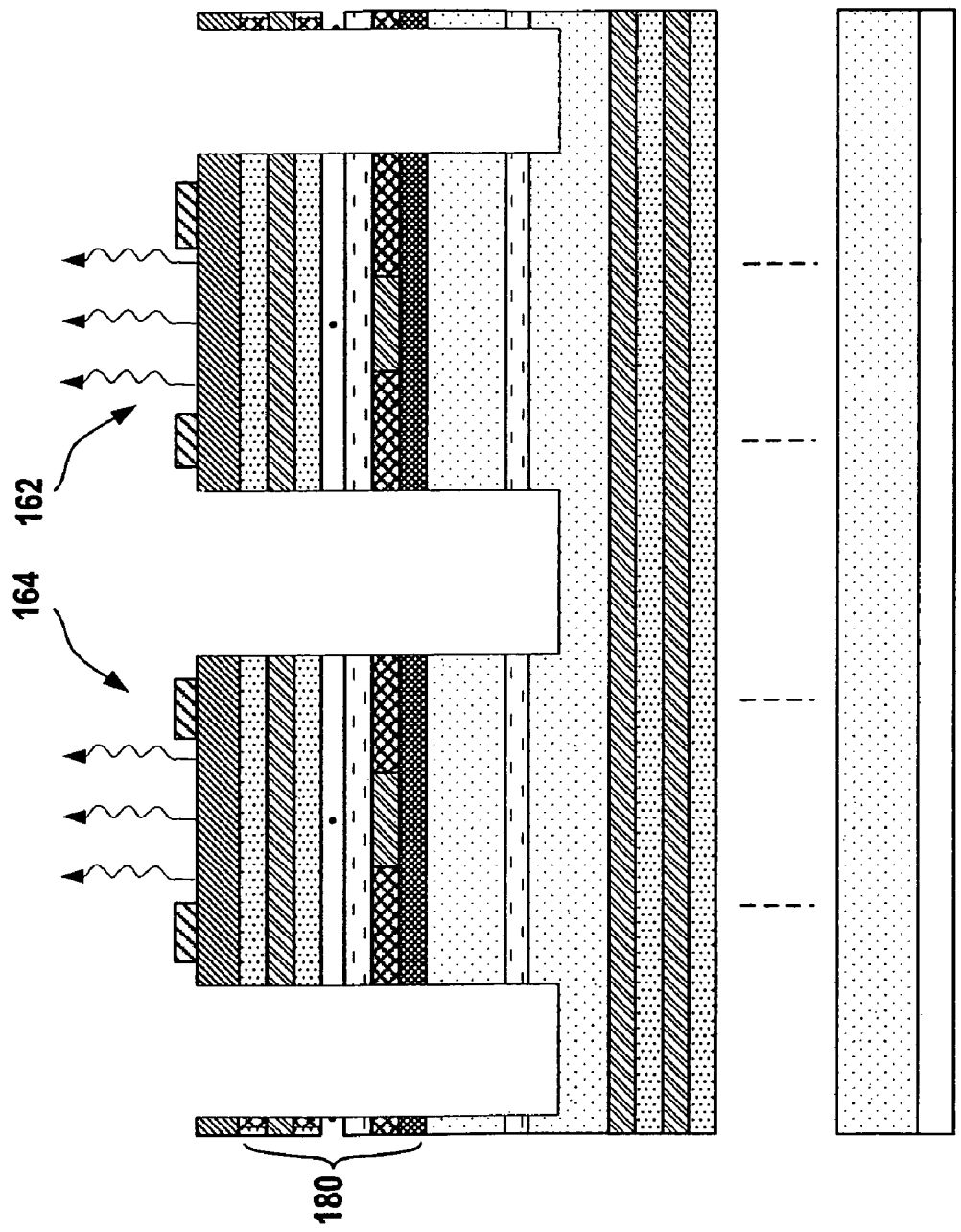

FIGS. 10A and 10B are cross-sectional side views of another illustrative VCSEL that uses an etch to reduce or eliminate some or all of the electrical artifacts believed to be caused by the junction between the oxidized and non-oxidized regions of a laterally oxidized DBR. FIG. 10A is similar to the embodiment shown in FIG. 8, but without the implant 218. Rather than providing the implant 218, or in addition to providing the implant 218, it is contemplated that a patterned etch or milling can be used to remove the oxide termination junctions of the AlGaAs aluminum bearing layers of the DBR 180. FIG. 10B shows the VCSEL wafer of FIG. 10A after such a patterned etch or milling is performed. As can be seen, the patterned etch removes the oxide termination junctions of the AlGaAs aluminum bearing layers of the DBR 180. In some embodiments, the patterned etch preferably extends vertically down past the active region, but this is not required in all embodiments. The lateral extent of the patterned etch may correspond to, for example, the extent of the implants shown in FIGS. 9A-9D.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. A Distributed Bragg Reflector (DBR), comprising:
one or more first DBR mirror layers, wherein each of the one or more first DBR mirror layers includes an oxidized region extending from an edge of the DBR to an oxide termination edge that is situated greater than a first distance from the edge of the DBR;
one or more second DBR mirror layers, wherein each of the one or more second DBR mirror layers includes an oxidized region extending from the edge of the DBR to an oxide termination edge that is situated less than a second distance from the edge of the DBR, wherein the first distance is greater than the second distance; and
at least a selected one of the first DBR mirror layers including an oxidizable material at a concentration that is above that of any of the one or more second DBR mirror layers, and wherein the selected one of the first DBR mirror layers is doped with an impurity at a higher level than at least some of the one or more second DBR mirror layers.

2. The Distributed Bragg Reflector according to claim 1, further comprising:
a transition region disposed between the selected one of the first DBR mirror layers and one of the second DBR mirror layers, wherein said transition region has a concentration of an oxidizable material that varies from a higher concentration near said selected one of the first DBR mirror layers to a lower concentration near the second DBR mirror layer.

3. The Distributed Bragg Reflector according to claim 1, wherein the selected one of the first DBR mirror layers is an oxide aperture forming layer.

4. The Distributed Bragg Reflector according to claim 1, wherein the first distance is greater than about two times the second distance.

5. The Distributed Bragg Reflector according to claim 1, wherein the first distance is about ten times the second distance.

6. The A Distributed Bragg Reflector according to claim 1, wherein the selected one of the first DBR mirror layers that includes an oxidizable material at a concentration that is above that of any of the one or more second DBR mirror layers, is doped with the impurity at a level greater than about 1EI8 atoms/cm$^3$.

7. The Distributed Bragg Reflector according to claim 1 wherein the selected one of the first DBR mirror layers that includes an oxidizable material at a concentration that is above that of any of the one or more second DBR mirror layers, is doped with the impurity at a level greater than about 5EI8 atoms/cm$^3$.

8. A Distributed Bragg Reflector comprising:
a first layer including an oxidizable material at a first concentration;
a second layer including an oxidizable material at a second concentration;
an oxide aperture forming layer including an oxidizable material at a third concentration, wherein the first concentration is less than the second concentration and the second concentration is less than the third concentration, and wherein said oxide aperture forming layer is disposed between said first layer and said second layer; and
a transition region disposed between said oxide aperture forming layer and said first layer, wherein said transition region includes an oxidizable material at a concentration that varies from a higher concentration near said oxide aperture forming layer to a lower concentration near said first layer.

9. The Distributed Bragg Reflector according to claim 8, wherein the first concentration is at or below 50%.

10. The Distributed Bragg Reflector according to claim 8, wherein the second concentration is at or below 90%.

11. The Distributed Bragg Reflector according to claim 8, wherein the second concentration is at or below 80%.

12. The Distributed Bragg Reflector according to claim 8, wherein the third concentration is at or above 95%.

13. The Distributed Bragg Reflector according to claim 8, wherein the transition region abuts the oxide aperture forming layer and the first layer.

14. The Distributed Bragg Reflector according to claim 8, wherein the oxide aperture forming layer abuts the second layer.

15. The Distributed Bragg Reflector according to claim 8, wherein the oxide aperture forming layer is doped with an impurity at a higher level than either the first layer or second layer.

16. The Distributed Bragg Reflector according to claim 8, wherein said transition region is about 20 nm thick.

17. The Distributed Bragg Reflector according to claim 8, further comprising:
a second transition region disposed between said oxide aperture forming layer and said second layer, wherein said second transition region includes an oxidizable material at a concentration that varies from a higher concentration near said oxide aperture forming layer to a lower concentration near said second layer.

18. The Distributed Bragg Reflector according to claim 8, wherein the oxidizable material includes aluminum.

19. A Distributed Bragg Reflector (DBR) having an edge, comprising:
one or more first DBR mirror layers, wherein each of the one or more first DBR mirror layers includes an oxidized region extending from the edge of the DBR to an oxide termination edge that is situated greater than a first distance from the edge of the DBR;
one or more second DBR mirror layers, wherein each of the one or more second DBR mirror layers includes an oxidized region extending from the edge of the DBR to an oxide termination edge that is situated less than a second distance from the edge of the DBR, wherein the first distance is greater than the second distance;
an implant configured and arranged to aid control of one or more electrical artifacts related to the oxide termination edge of at least some of the one or more second DBR mirror layers; and
at least a selected one of the first DBR mirror layers including an oxidizable material at a concentration that is above that of any of the one or more second DBR mirror layers, wherein the selected one of the first DBR mirror layers is doped with an impurity at a higher level than any of the one or more second DBR mirror layers.

20. The Distributed Bragg Reflector according to claim 19, further comprising:
a transition region disposed between the selected one of the first DBR mirror layers and one of the second DBR mirror layers, wherein said transition region has a concentration of an oxidizable material that varies from a higher concentration near said selected one of the first DBR mirror layers to a lower concentration near the second DBR mirror layer.

21. The Distributed Bragg Reflector as recited in claim 19, wherein said selected one of the first DBR mirror layers is disposed at or near an expected null of an electric field produced by resonant laser light.

* * * * *